US011866322B2

(12) United States Patent
Wang et al.

(10) Patent No.: US 11,866,322 B2
(45) Date of Patent: Jan. 9, 2024

(54) ULTRAFAST PHOTONIC MICRO-SYSTEMS

(71) Applicant: UCHICAGO ARGONNE, LLC, Chicago, IL (US)

(72) Inventors: Jin Wang, Hinsdale, IL (US); Donald A. Walko, Woodridge, IL (US); Pice Chen, Lemont, IL (US); Il Woong Jung, Lemont, IL (US); Daniel Lopez, Lemont, IL (US)

( * ) Notice: Subject to any disclaimer, the term of this patent is extended or adjusted under 35 U.S.C. 154(b) by 199 days.

(21) Appl. No.: 17/196,710

(22) Filed: Mar. 9, 2021

(65) Prior Publication Data
US 2021/0284526 A1 Sep. 16, 2021

Related U.S. Application Data

(60) Provisional application No. 62/987,760, filed on Mar. 10, 2020.

(51) Int. Cl.
*B81B 3/00* (2006.01)
*G02B 27/42* (2006.01)

(52) U.S. Cl.
CPC ........ *B81B 3/0083* (2013.01); *G02B 27/4233* (2013.01); *B81B 2201/047* (2013.01)

(58) Field of Classification Search
CPC .. H04N 19/105; H04N 19/109; H04N 19/126; H04N 19/167; H04N 19/176; H04N 19/177; H04N 19/513; H04N 19/543; H04N 19/597; H04N 19/61; H04N 19/62; H04N 19/64; B81B 2201/047; B81B 3/0083; G02B 26/0808; G02B 26/0841; G02B 27/4233; G21K 1/043; G21K 2201/062

See application file for complete search history.

(56) References Cited

U.S. PATENT DOCUMENTS

2005/0094694 A1* 5/2005 Fujihara ................. G11B 7/123
2019/0196179 A1* 6/2019 Sarkar ................. G02B 27/1086

OTHER PUBLICATIONS

Cowen, et al., "SOIMUMPs Design Handbook," MEMSCAP Inc., 26 pages (2011).
Evoy, et al., "Nanofabrication and Electrostatic Operation of Single-Crystal Silicon Paddle Oscillators," Journal of Applied Physics 86(11), pp. 6072-6077 (1999).
Hopcroft, et al., "What is the Young's Modulus of Silicon?," Journal of Microelectromechanical Systems 19(2), pp. 229-238 (2010).
Hsu, et al., "Fracture Strength of SOI Springs in MEMS Micromirrors," Proceedings SPIE 6466, 9 pages (2007).

(Continued)

*Primary Examiner* — Joseph P Martinez
*Assistant Examiner* — Vipin Patel
(74) *Attorney, Agent, or Firm* — Foley & Lardner LLP

(57) ABSTRACT

A microelectromechanical device for diffracting optical beams comprises a diffractive element suspended over a channel. The diffractive element is configured to receive an optical beam and diffract and/or transmit the optical beam based on an orientation of the diffractive element. At least one torsional actuator is operatively connected to the diffractive element. The at least one torsional actuator is configured to selectively adjust the orientation of the diffractive element. The diffractive element has a diffractive element resonant frequency that is nearly the same as a resonant frequency of the optical beam.

18 Claims, 16 Drawing Sheets

(56) References Cited

OTHER PUBLICATIONS

Joshi, et al., "Enhanced Thermoelectric Figure-of-Merit in Nanostructured p-type Silicon Germanium Bulk Alloys," Nano Letters 8(12), pp. 4670-4674 (2008).
Liu, et al., "Capturing metastable structures during high-rate cycling of LiFePO4 nanoparticle electrodes," Science 344(6191), 1252817, 8 pages (2014).
MacPhee, et al., "X-ray Imaging of Shock Waves Generated by High-Pressure Fuel Sprays," Science 295(5558), pp. 1261-1263 (2002).
Mukhopadhyay, et al., "X-ray photonic microsystems for the manipulation of synchrotron light," Nature Communications 6, 7057, 7 pages (2015).
Parratt, "Electronic Band Structure of Solids by X-Ray Spectroscopy," Reviews of Modern Physics 31, pp. 616-645 (1959).
Petersen, "Silicon as a Mechanical Material," Proceedings of the IEEE 70(5), pp. 420-457 (1982).
Russell & Rose, "X-ray absorption spectroscopy of low temperature fuel cell catalysts,"Chemical Reviews 104(10), pp. 4613-4636 (2004).
Wang, et al., "Ultrafast X-ray study of dense-liquid-jet flow dynamics using structure-tracking velocimetry," Nature Physics 4, pp. 305-309 (2008).
Wilkins, et al., "Phase-contrast imaging using polychromatic hard X-rays," Nature 384, pp. 335-338 (1996).
Wolter, et al., "Torsional stress, fatigue and fracture strength in silicon hinges of a micro scanning mirror," Proceedings SPIE 5343, pp. 176-186 (2003).

\* cited by examiner

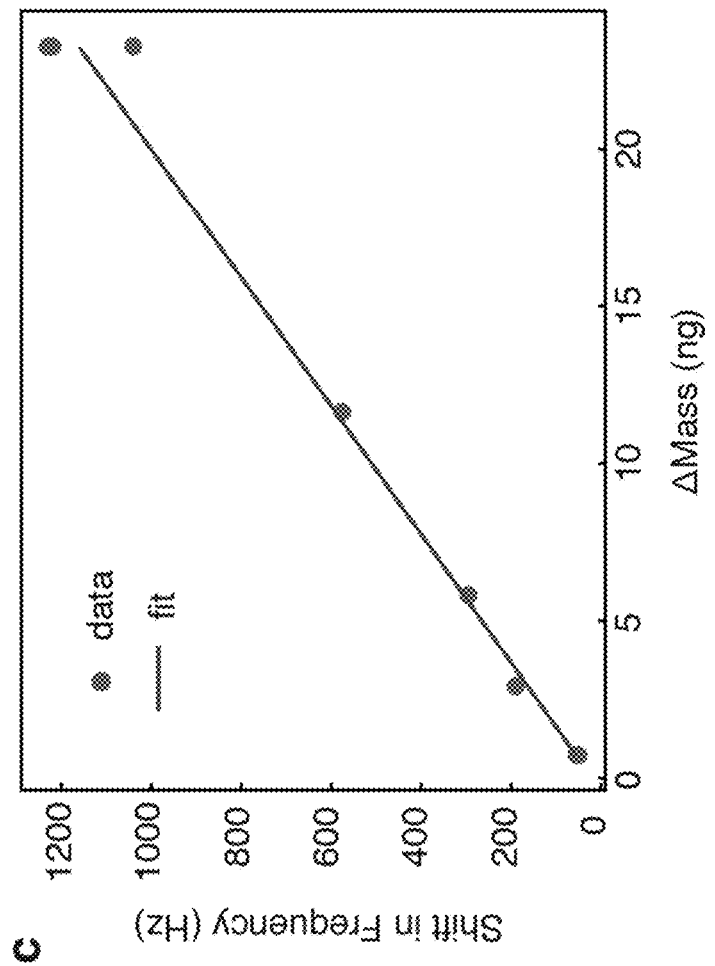
FIG. 6C
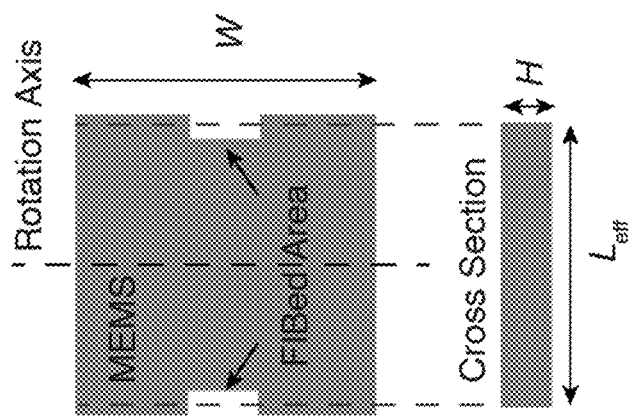
FIG. 6A
FIG. 6B

ULTRAFAST PHOTONIC MICRO-SYSTEMS

CROSS-REFERENCE TO RELATED PATENT APPLICATIONS

This application claims priority to and the benefit of U.S. Provisional Application No. 62/987,760, filed Mar. 10, 2020, the content of which is incorporated herein by reference in its entirety.

GOVERNMENT SUPPORT CLAUSE

This invention was made with government support under Contract No. DE-AC02-06CH11357 awarded by the United States Department of Energy to UChicago Argonne, LLC, operator of Argonne National Laboratory. The government has certain rights in the invention.

TECHNICAL FIELD

The present disclosure relates generally to microelectro-mechanical-system ("MEMS"), more particularly to MEMS oscillator resonant frequencies and the use of MEMS having tuned frequencies to manipulate hard x-rays at the sub-nanosecond level.

BACKGROUND

Materials with nanoscopic-to-mesoscopic structures have taken center stage in advancing science and technology. There have been major efforts in establishing the structure-function relationship of materials on these length scales employing a variety of physical and chemical probes, and hard X-ray tools have played an important role to this effort. However, a deeper understanding of energy conversion, storage, transmission, and utilization requires a complete mapping of the spatiotemporal behavior of relevant processes in, for example, solar and thermoelectric conversion, fuels cells and batteries, and efficient and clean combustion. These processes include carrier dynamics, phonon transport, ionic conduction, multicomponent diffusion, phase transformation, interfacial diffusion, multiphase fluid flow, strain propagation, and soot formation on the temporal scales of microseconds and less. Spatiotemporal X-ray probes with similar time resolution and spatial resolution—from picometers to mesoscopic scales—are essential to meeting this challenge. While X-ray free-electron lasers ("XFEL5") with a femtosecond pulse width are extremely effective in probing dynamics on ultrashort time scales, synchrotron-based X-ray sources are well suited for revealing the spatiotemporal evolution of mesoscopic details in materials. However, temporal resolution at synchrotron sources is generally limited by the X-ray pulse duration in the range of 10-100 s of picoseconds. Accessing shorter time scales, for example a few picoseconds, requires complex and costly modification of the storage ring at the expense of other source characteristics such as intensity and brightness.

On the other hand, photonic devices based on microelectromechanical systems ("MEMS") technology have been implemented in a wide range of applications and scientific research. The ability to manipulate light dynamically in a compact package is highly desirable in many scientific and technological applications. In addition, favorable scaling laws for miniaturization result in capabilities not possible with macro-scale devices. In the MEMS photonics community, the wavelengths of interest have been mainly in the visible to infrared regions for a wide range of imaging and telecommunication applications. As previously shown, a MEMS oscillator, asynchronous to the X-ray source, can create and preserve the spatial, temporal, and spectral correlation of the X-rays on a time scale of several nanoseconds.

SUMMARY

Time-resolved and ultrafast hard X-ray imaging, scattering and spectroscopy are powerful tools for elucidating the temporal and spatial evolution of complexity in materials. However, their temporal resolution has been limited by the storage-ring timing patterns and X-ray pulse width at synchrotron sources. Here it is demonstrated that dynamic X-ray optics based on micro-electro-mechanical-system resonators can manipulate optical beams such as hard X-ray pulses on time scales down to about 300 ps, comparable to the X-ray pulse width from typical synchrotron sources. This is achieved by timing the resonators with the storage ring to diffract X-ray pulses through the narrow Bragg peak of the single-crystalline material. Angular velocities exceeding $10^7$ degrees $s^{-1}$ are reached while maintaining the maximum linear velocity well below the sonic speed and material breakdown limit. As the time scale of the devices shortens, the devices promise to spatially disperse the temporal width of the optical beam such as X-rays, thus generating a temporal resolution below the pulse-width limit.

In some embodiments, microelectromechanical device for diffracting optical beams comprises: a diffractive element suspended over a channel, the diffractive element configured to receive an optical beam and diffract and/or transmit the optical beam based on an orientation of the diffractive element; and at least one torsional actuator operatively connected to the diffractive element, the at least one torsional actuator configured to selectively adjust the orientation of the diffractive element, wherein the diffractive element has a diffractive element resonant frequency that is nearly the same as a resonant frequency of the optical beam.

In some embodiments, a microelectromechanical system for diffracting optical beams, the system comprises: a microelectromechanical device for diffracting optical beams comprising: a diffractive element suspended over a channel, the diffractive element configured to receive an optical beam and diffract and/or transmit the optical beam based on orientation of the diffractive element; at least one torsional actuator operatively connected to the diffractive element, the at least one torsional actuator configured to selectively adjust the orientation of the diffractive element; a controller configured to relay a timing signal to the microelectromechanical device; a detector configured to receive the optical beam diffracted and/or transmitted by the diffractive element and generate an output data; and a display configured to receive the output data from the detector and display the output data.

In some embodiments, a method of forming a microelectromechanical system device, the method comprising: forming a diffractive element on a substrate the diffractive element configured to receive an optical beam and diffract and/or transmit the optical beam based on an orientation of the diffractive element; forming a channel in the substrate such that the diffractive element is suspended over the channel; forming at least one torsional actuator on the substrate such that the torsional actuator is operatively coupled to the diffractive element; and forming at least one notch in the diffractive element as to cause a resonant frequency of the diffractive element to be nearly the same as a resonant frequency of the optical beam.

It should be appreciated that all combinations of the foregoing concepts and additional concepts discussed in greater detail below (provided such concepts are not mutually inconsistent) are contemplated as being part of the subject matter disclosed herein. In particular, all combinations of claimed subject matter appearing at the end of this disclosure are contemplated as being part of the subject matter disclosed herein.

BRIEF DESCRIPTION OF DRAWINGS

The foregoing and other features of the present disclosure will become more fully apparent from the following description and appended claims, taken in conjunction with the accompanying drawings. Understanding that these drawings depict only several implementations in accordance with the disclosure and are therefore, not to be considered limiting of its scope, the disclosure will be described with additional specificity and detail through use of the accompanying drawings.

FIG. 1A is a schematic of a rapidly oscillating diffractive element (e.g., a MEMS crystal, a silicon crystal, a single crystal micro-mirror etc.) in a torsional MEMS device that diffracts monochromatic X-rays at its Bragg angle. FIG. 1B is a static crystal rocking curve around Bragg angle $\theta_B$ with a full-width-at-half-maximum ("FWHM") of $\Delta\theta_B$, typically several milli-degrees. FIG. 1C shows around the instance that diffractive element (e.g., a MEMS crystal, a silicon crystal, a single crystal micro-mirror etc.) rotates through the Bragg angle, the diffractive element rocking curve converts to a temporally dispersed diffractive time window ("DTW") with a FWHM of $\Delta t_w$. FIG. 1D shows when the DTW width is much wider than the X-ray pulse, but narrower than the pulse-to-pulse spacing, the MEMS can be utilized as an ultrafast pulse-picking device. FIG. 1E shows when the DTW is narrower than the X-ray pulse, the device creates optical beams such as X-ray pulses shorter than the incident pulse width in a form of pulse slicing in the time domain. FIG. 1F shows dispersion/streaking of the X-ray pulse is possible, when the MEMS DTW is close to the incoming pulse width. FIG. 1G shows in the dispersion/streaking mode using a position-sensitive detector ("PSD"), the oscillating MEMS converts the optical beam such as a X-ray pulse in the time domain to a spatially dispersed signal that contains time-resolved, sub-pulse information.

FIGS. 2A-2B show scanning electron microscopy images of the MEMS device as fabricated and after multiple rounds of FIB micromachining, respectively. FIG. 2C shows tuning curves of the MEMS device measured with 45-V (peak-to-valley) square pulses after each FIB micromachining. Note that the frequency denoted in the X-axis is the frequency of excitation voltage signal, or twice the resonant frequency of MEMS devices. A total of eight micromachining processes were performed to tune the device to 135.777 kHz (P0/2) as P0 being the optical beam source frequency.

FIG. 3A shows tuning curves of the P0/2 MEMS at excitation voltages from about 50 V to about 100 V in the vicinity of P0/2. Inset to FIG. 3a shows the peak amplitude as a function of the excitation voltage. FIG. 3B shows precise measurement of oscillation amplitude using the X-ray pulses while the MEMS device is excited exactly at a frequency of P0/2. It is noted that the delay time covered only a fraction of the MEMS oscillation period near null delay time, where the oscillation amplitude measurement is extremely sensitive and more accurate than any optical and electrical methods available to date. T is the oscillation period equal to 2/P0, or about 7.365 μs. FIG. 3C shows DTW measured by about an 8-keV X-ray time-delay scans when the excitation voltages increased from about 60 V to about 90 V, at which time the DTW width drops to below 0.5 ns. The curve denoted as 45 V is from an as-fabricated device that is not frequency-matched to an optical beam such as X-ray pulses. The arrow pointing upward marks the direction of increasing oscillation amplitude. FIG. 3D shows a comparison between the expected and measured DTW as a function of the excitation voltage at 135.777 kHz. The expected DTW is calculated using Eq. 1 and the amplitude values from FIG. 3B, which have a linear relationship with the excitation voltage, shown as the blue symbols (data) and line (linear fit). The shaded areas indicate sub-nanosecond DTW where it becomes impractical to use a higher voltage to achieve narrower DTW in P0/2 MEMS devices.

FIG. 4A shows tuning curves of the P0 device at atmospheric pressure (100 kPa) environment at the onset voltage of 70 V and at a very high voltage of 110 V, and in a reduced pressure of 6.6 kPa at 50 V and 70 V. At 6.6 kPa, similar oscillation amplitudes can be achieved at much lower voltages and the Q factor of the oscillation is also improved as the tuning curves become much narrower. FIG. 4B shows dependence of the oscillation amplitude on excitation voltage at 100 kPa and reduced pressures. Note that an amplitude of 10° can be achieved at lower voltages of 70V (13.2 kPa) and 60 V (6.6 kPa). FIG. 4C shows DTW measurement using delay time scans at excitation voltage ranging from 50 to 70 V at a reduced pressure of 13.2 kPa. The DTW width reaches 0.5 ns at a moderate voltage of 70 V. The dependence of the DTW on the excitation voltage is shown in the inset to the figure, where the fit (line) assumes a linear relationship between the oscillation amplitude and the voltage. FIG. 4D shows tuning curves of the P0 device operated in a pressure range from 59.2 kPa down to 6.6 kPa at an excitation voltage 60 V. FIG. 4E shows time delay scans of the high-frequency device at 52.6, 26.3, and 6.6 kPa at 60 V. The DTW width reaches below 0.5 ns at 6.6 kPa even at this modest excitation voltage. FIG. 4F shows dependence of DTW on the environmental pressure at 60 V. The DTW width (circle) decreases almost one order of magnitude from 3.69 ns to 0.47 ns as the pressure drops from 52.6 to 6.6 kPa.

FIG. 5A shows a delay scan of a single X-ray pulse showing a 301-ps DTW. FIG. 5B shows a time-delay scan covering two consecutive pulses in the Advanced Photon Source 324-bunch mode when the two X-ray pulses are 11.37 ns apart. The scan clearly demonstrates DTW widths of 300 ps over the 16-ns delay time, measured in a time span of ca. 235 s.

FIGS. 6A-6C show tuning the resonant frequency of MEMS devices by FIB machining. FIG. 6A is a schematic of the optical beam diffracting element of a MEMS device, after the FIB process symmetrically machined away the notched areas. FIG. 6B is a schematic of the cross section of the silicon element that is approximated as rectangular. FIG. 6C shows the shift of the peak frequency of the tuning curve of a P0/2 MEMS device, as a function of the amount of the mass of silicon removed after each FIB process. The line is a linear fit to the data.

FIG. 7A is a rocking curve from a P0/2 MEMS device, and FIG. 7B is a rocking curve from a P0 device. The lines are fit to the data, with two components: diffraction from diffractive element (e.g., a MEMS crystal, a silicon crystal, a single crystal micro-mirror etc.) (004), and diffraction from phosphorous dopant-induced strained layers on the surface.

FIG. 8A is a schematic of experimental setup using x-rays from 324-bunch mode at the APS. FIG. 8B is a schematic showing the relationship between Bragg angle ($\theta_B$) and the oscillation angle of MEMS devices ($\theta_{MEMS}$). The dots mark the times when the oscillation angle is equal to the Bragg angle, or when the Bragg condition is satisfied during oscillation. FIG. 8C illustrates scope traces of real-time x-ray response to an oscillating MEMS device (P0/2, excited with 60 V). The time-axis is folded so that each half-cycle measurement is overlaid onto the other within the full cycle. Different colors represent the measurements at different resting theta positions $\theta_0$ of the MEMS device. FIG. 8D shows the resting theta angle, with respect to Bragg angle, plotted as a function of the relative times where x-ray pulses were observed in the scope traces. The two lines are sinusoidal fits to the angular rotation of MEMS device.

FIG. 9A is a schematic of the experimental setup used to perform delay scans. FIG. 9B is a schematics of periodic x-ray pulses from a storage-ring synchrotron source, as well as Bragg peaks of MEMS devices in time domain, at three different delay times ($t_1<0$, $t_2=0$, $t_3>0$) where the zero-delay-time is when the peak of the dynamic rocking curve coincides with one of the x-ray pulses. FIG. 9C illustrates example delay scan mapping out the diffractive time window of a MEMS device. The effect from the side peaks of the dopant layer is apparent on both sides of the (400) Bragg peak because the peaks are scanned from both angular directions. $t_1$, $t_2$, and $t_3$ are the three delay time values illustrated in FIG. 9B.

FIG. 10A illustrates an incident beam profile and diffracted beam profile measured when the MEMS device is stationary (FIG. 10B) and oscillating (FIG. 10C). The measurement was conducted by scanning the angle of the detector arm, then converting the angular position to spatial units for better representation of beam size.

FIG. 11A shows intensity at the low-angle shoulder of Bragg peak as a function of time, after x-ray turned on at t=0. X-ray flux in this measurement is estimated to be $2\times10^{10}$ photons/s. FIG. 11B shows relative shift of peak position of rocking curves of MEMS device. The plots are from two series of scans, one scanning $\theta$ low to high and the other high to low.

FIG. 12A is a schematic of a P0/2 MEMS device where the mechanical boundary of the torsional spring (boxed region) is specified. FIG. 12B is a magnified view of the torsional spring as a bar subjected to a torque Tat both ends.

FIG. 13 shows how the diffractive element and the at least one torsional actuator are placed within the vacuum chamber and the path of the optical beam when in operation.

Figure 1A:
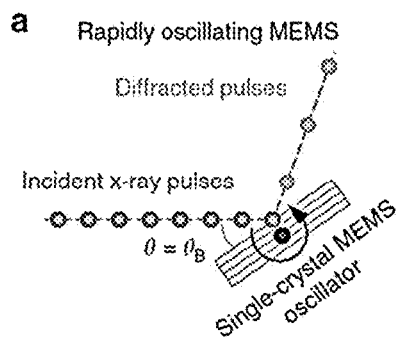
FIGS. 1A-1G show manipulation of optical beams such as hard X-ray pulses using a microelectromechanical-system ("MEMS")-based oscillator.

Reference is made to the accompanying drawings throughout the following detailed description. In the drawings, similar symbols typically identify similar components, unless context dictates otherwise. The illustrative implementations described in the detailed description, drawings, and claims are not meant to be limiting. Other implementations may be utilized, and other changes may be made, without departing from the spirit or scope of the subject matter presented here. It will be readily understood that the aspects of the present disclosure, as generally described herein, and illustrated in the figures, can be arranged, substituted, combined, and designed in a wide variety of different configurations, all of which are explicitly contemplated and made part of this disclosure.

DETAILED DESCRIPTION OF VARIOUS EMBODIMENTS

Embodiments described herein relate generally to systems and method for tuning of microelectromechanical-system ("MEMS") oscillator resonant frequencies and the use of MEMS having tuned frequencies to manipulate hard x-rays at the sub-nanosecond level.

In this work, it is demonstrated that a MEMS-based X-ray dynamic optics, oscillating with a frequency matched to a synchrotron storage ring with a 1.1-km circumference, can control and manipulate optical beams such as hard X-ray pulses significantly below one nanosecond at 300 ps. This exceptional time scale makes it one step closer to achieving pulse streaking and pulse slicing which would allow access to information at a sub-pulse temporal scale.

MEMS Devices as Dynamic X-Ray Optics.

Figure 1B:
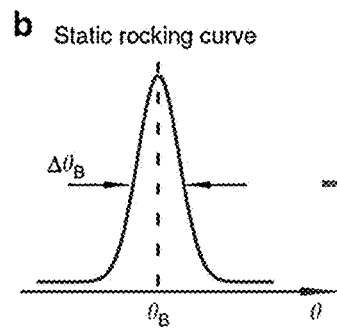
Figure 1C:
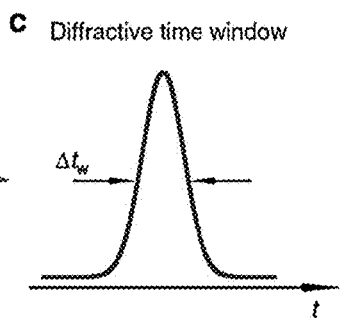
Figure 1D:
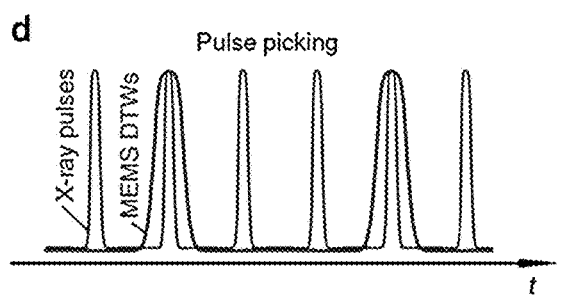
Figure 1E:
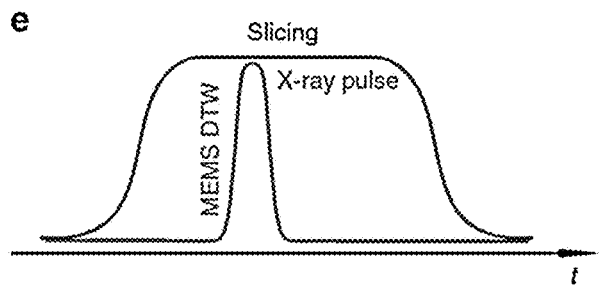
Figure 1F:
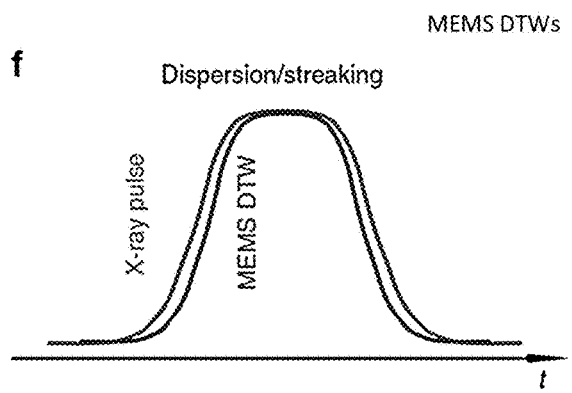
Figure 1G:
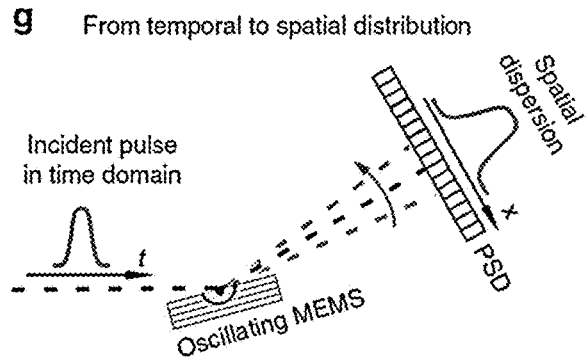

The concept of using a MEMS device in the X-ray wavelength range as a dynamic diffractive optics for a monochromatic beam is shown schematically in FIGS. 1A-1G. A diffractive element (e.g., a MEMS crystal, a silicon crystal, a single crystal micro-mirror etc.) of a MEMS device can in some embodiments diffract optical beams just by a change in its orientation relative to the incident optical beam (FIG. 1A). In some embodiments the diffractive element (e.g., a MEMS crystal, a silicon crystal, a single crystal micro-mirror etc.) of a MEMS device can transmit and absorb optical beams just by a change in its orientation relative to the incident optical beam (FIG. 1A). In some embodiments the diffractive element is a thin, single-crystal silicon MEMS. In some embodiments, the optical beams being transmitted or diffracted are X-rays. In some embodiments the optical beams being transmitted or diffracted are hard X-rays, X-ray pulses, gamma rays, radio-waves, microwaves, or infrared rays. When the Bragg condition is fulfilled, the diffractive beam intensity as a function of the incident angle, $\theta$, can be described by a rocking curve, illustrated in FIG. 1B, around the Bragg angle, $\theta_B$. As the diffractive element rapidly adjusts its orientation in the vicinity of $\theta_B$, a diffractive time window (DTW, as shown in FIG. 1C) opens during that time period. In some embodiments, the diffractive element's orientation is adjusted by either rapidly oscillating or rapidly rotating. There are three schemes for utilization of MEMS devices: First, when the DTW is wider than the individual synchrotron X-ray pulses, but narrower than the pulse interval, the MEMS device can be employed as an optical beam pulse-picking chopper, as shown in FIG. 1D. Second, if the DTW is narrower than the optical beam, for example X-ray, width (as shown in FIG. 1E), the MEMS device will generate X-ray pulses shorter than the incident pulses, which enables time-resolved experiments to be performed with a temporal resolution higher than that given by the incident pulse duration. Parenthetically, this scheme also applies to continuous X-rays such as lab sources. Third, when the DTW is comparable to or slightly narrower than the width of the optical beam, for example X-ray, (as seen in FIG. 1F), an X-ray streaking theme can be envisioned, completely in the optical domain, without sacrificing the detection efficiency, a problem suffered by other photonic devices such as X-ray streak cameras. The conversion from X-ray pulse in the time domain to a streaked signal in the spatial domain is illustrated in FIG. 1G, where a high-resolution, position-sensitive detector accomplishes the conversion. This could lead to information in the single-pulse duration with sub-pulse temporal resolution. To make possible the applications of MEMS devices as dynamic X-ray optics, the MEMS DTW has to be sufficiently narrow. A high-frequency device is essential for pulse-picking, while a minimum DTW is more critical for pulse-slicing and streaking applications.

Since MEMS devices are generally based on single-crystal silicon, X-ray diffraction occurs at the or near the Bragg angle, $\theta_B$, at which the incident X-rays satisfy the Bragg condition. Due to the dynamical diffraction process, the angular width of the diffraction condition is not zero, but has a finite value ($\Delta\theta_B$, or rocking curve width), as illustrated in FIG. 1B. As the MEMS device oscillates around $\theta_B$ (FIG. 1A), the diffractive element (e.g., a MEMS crystal, a silicon crystal, a single crystal micro-mirror etc.), will diffract the X-rays for the short amount of time in which the Bragg condition is satisfied, and the element will transmit and absorb the X-rays over the rest of the cycle. The oscillatory device transforms the static rocking curve into a dynamic one in the time domain, i.e., DTW (FIG. 1C). The maximum angular speed of the MEMS device determines the width of the DTW over which the Bragg condition is fulfilled. For use as a monochromatic X-ray optic, the width of the DTW, $\Delta t_w$, is given by:

$$\Delta t_w = \frac{\Delta\theta_B}{2\pi f \alpha} \quad (1)$$

where f and $\alpha$ are the MEMS oscillation frequency and amplitude, respectively. In order to interact with X-ray pukes while preserving their spatiotemporal correlation, a MEMS device must perform as an X-ray diffractive element with the highest reflectivity while maintaining this performance at high speeds without introducing any distortion to the incident X-ray wavefront.

Tuning the MEMS Resonant Frequency to Match the Storage-Ring Frequency.

Figure 2A:
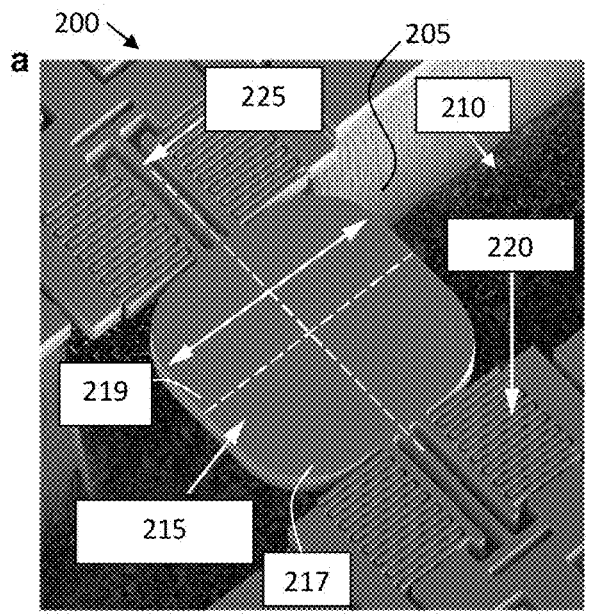
FIGS. 2A-2C show tuning the resonant frequency of a MEMS oscillator using focused ion beam ("FIB").
Figure 2B:
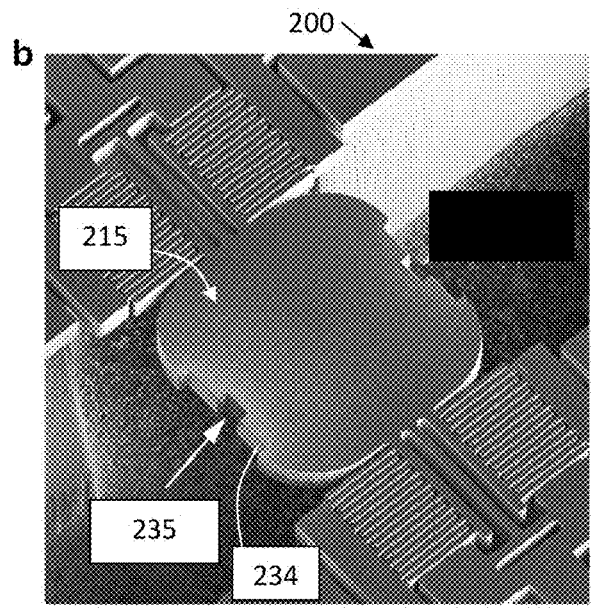
Figure 2C:
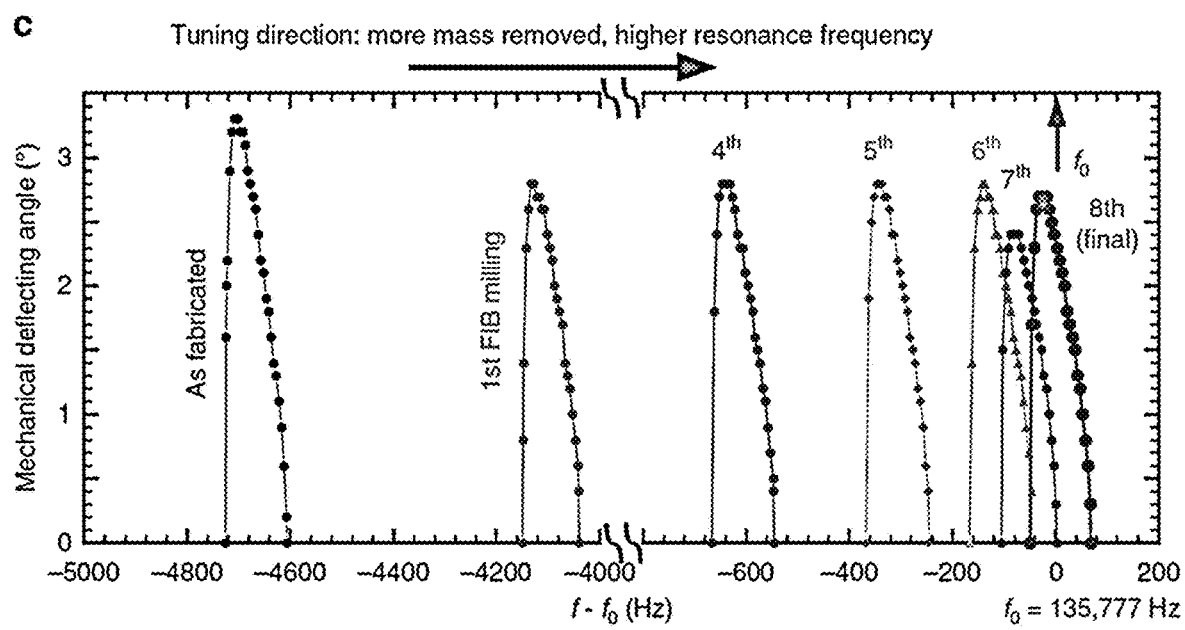

FIGS. 2A-2C show tuning the resonant frequency of a MEMS device. Referring to FIG. 2A, a MEMS device 200 is structured to receive optical beams from a device capable of emitting optical beams such as storage ring or a synchrotron. The MEMS device 200 includes a substrate 205, a channel 210, a diffractive element 215, a torsional actuator 220, and a torsional flexure arm 225. The diffractive element 215 has an oscillation axis 217 about which the diffractive element 215 is displaced (e.g., rotates or oscillates) and a non-oscillation axis 219.

The MEMS device 200 is formed on a substrate 205. In some embodiments, the substrate 205 has a channel 210 etched into it. The diffractive element 215 is then suspended above the channel by the torsional actuator 220 and the torsional flexure arm 225. In some embodiments, the diffractive element 215 is a single-crystal silicon. In some embodiments, the diffractive element 215 may be a crystal fabricated from germanium, silicon-germanium, silicon-carbide, or any other material used for fabricating a crystal for a MEMS device. In further connection, the torsional flexure arm 225 includes a first torsional flexure arm end which is connected to the substrate 205 and a second torsional flexure arm end connected to the diffractive element 215 on the other end. In some embodiments, the torsional flexure arm 225 is anchored by the first torsional flexure arm end to the substrate 205 and is in line with an oscillation axis of the diffractive element 215 as depicted in FIG. 6A. In some embodiments, the torsional flexure arm 225 is a torsional spring. Additionally, the torsional actuator 220 is operatively connected to the diffractive element 215 at a first end and electrically connected to a power source on a second end. In some embodiments, the torsional actuator 220 is connected to the torsional flexure arm 225 and connected to the diffractive element 215. In some embodiments, the torsional actuator 220 is an inter-digitated capacitor. In some embodiments, the torsional actuator 220 is a comb-drive. While shown in FIG. 2A as including two torsional actuators 220, in other embodiments, the MEMS device 200 may include a single torsional actuator.

In operation, a device capable of emitting optical beams, emits an optical beam at the MEMS device 200. In some embodiments, the optical beam is emitted to the diffractive element 215. A power source provides an electrostatic force to the torsional actuator 220 causing the torsional actuator 220 to be electrically excited. This allows for the diffractive element 215 to rapidly adjust its orientation about the oscillation axis 217. In some embodiments, the diffractive element 215 rapidly adjusts its orientation by oscillating about the oscillation axis 217 at a frequency. In some embodiments, the diffractive element 215 rapidly adjusts its orientation by rotating about an oscillation axis 217 at a frequency. In some embodiments, as the diffractive element 215 adjusts its orientation about an oscillation axis, the torsional flexure arm 225 provides a counter force to the diffractive element 215. In some embodiments, the diffractive element 215 adjusts its orientation such that it has a diffractive element resonant frequency that matches the resonant frequency of the optical beam. In some embodiments, the diffractive element resonant frequency is nearly the same to the resonant frequency of the optical beam. Here, when the diffractive element resonant frequency is nearly the same to the resonant frequency of the optical beam, the value of the diffractive element resonant frequency is plus or minus 10% of the value of the resonant frequency of the optical beam.

To be a dynamic optics for pulsed X-rays in an efficient way, the oscillation may be in synchrony or frequency-matched with the X-ray source. In some embodiments the oscillation must be in synchrony or frequency-matched with the X-ray source. Since MEMS resonators with a quality factor (Q) exceeding $10^3$ have an extremely narrow resonant bandwidth, it is virtually impossible for an as-fabricated MEMS device to have a resonant frequency that coincides with the storage-ring frequency. An asynchronous device cannot be an effective X-ray optics at a light source that produces periodic pulses. In order to tune the frequency of the MEMS device 200 to be commensurate with the frequency of the synchrotron ring, as shown in FIG. 2B, a notch 234 is formed (e.g., etched) into the diffractive element 215. In some embodiments the notch 234 is formed on both edges of the diffractive element 215 that are parallel to the oscillation axis 217 and orthogonal to the non-oscillation axis 219. In some embodiments, more than one notch 235 is formed on opposite edges of the diffractive element 215 (e.g., a first notch 234 and, a second notch 235 within the first notch, etc.). In some embodiments, the first notch 234 and second notch 235 are formed using photolithography and etching procedures which may include wet etching, dry etching, reactive ion etching, deep reactive ion etching, laser etching or any other procedure for etching. In some embodiments, a highly precise frequency trimming process based on focused ion beam ("FIB") techniques (e.g. focused ion beam etching) was used to form the first notch 234 and the second notch 235. The tuning process started with an as-fabricated MEMS with a resonant frequency of 65.8 kHz, about 2 kHz lower than the desired frequency of 67.889 kHz (one-fourth of the Advanced Photon Source ("APS") operation frequency of P0=271.555 kHz).

Some embodiments can utilize focused ion beam machining for the tuning of the resonant frequency. The microelectro-mechanical systems (MEMS) devices are torsional actuators with a resonant frequency f as:

$$f = \sqrt{\frac{k}{l}} \quad (1A)$$

where k and l are the stiffness of the torsional flexure and the moment of inertia of the oscillating part. As in a rectangular prism, $$I = \frac{1}{12}m(L_{eff}^2 + H^2) \approx \frac{1}{12}\rho HWL_{eff}^3,$$

where m and ρ are the mass and density of the structural material silicon; and H (thickness), W (width), and $L_{eff}$ (effective length) are the dimensions of the silicon mirror, as denoted in FIGS. 6A-6B. The FIB process milled away silicon from the outer edges of the mirror and resulted in notches as shown schematically in FIGS. 6A-6B. To simplify the calculation, the notched mirror is approximated as a rectangular prism using an effective length $L_{eff}$. The change in the mass of the silicon mirror resulted from the FIB process is equivalent to the change of the effective length, which in turn shifts the resonant frequency. Taking the derivative of Eq. 1A, it can be deduced that the resonant frequency shift (Δf) is related to the change of mass (Δm) as:

$$\frac{\Delta f}{f} = -\frac{3\Delta m}{2m} \quad (2)$$

Therefore, the increase of the resonant frequency is proportional to the amount of removed mass from the far edges of the element. An example of the shift of frequency of a P0/2 MEMS device during the FIB process is shown in FIG. 6C. To be consistent with the main text, the frequency here is referred to the driving frequency, twice the value of the resonant frequency. The target value of the driving frequency for this device is about 135.777 kHz. The diffractive element (e.g., a MEMS crystal, a silicon crystal, a single crystal micro-mirror etc.) has a dimension of about 250 μm by 250 μm by 25 μm, corresponding to a total mass of about 3640 ng. Based on Eq. 1A the expected slope is calculated to be about 56 Hz/ng, in good agreement with the measurement, where the slope from the linear fit to the data is about 49 Hz/ng.

As can be seen in FIG. 2A, the MEMS device uses a diffractive element 215. In some embodiments the diffractive element 215 is a torsional oscillating silicon crystal that has a 25 μm thickness, a length of 250 μm, a width of 250 μm and a 250×250 μm² in area, actuated with in-plane comb-drive actuators. In some embodiments, the diffractive element 215 has a thickness between 15 μm and 35 μm. In some embodiments, the diffractive element 215 has a length between 200 μm and 300 μm. In some embodiments, the diffractive element 215 has a width between 200 μm and 300 μm. The sinusoidal oscillation of the diffractive element 215 is excited by power source which generates an electro static force to the torsional actuator 220. In some embodiments the sinusoidal oscillation of the diffractive element 215 is excited by a square-wave voltage signal with a frequency twice that of the resonant frequency of MEMS devices at 135.777 kHz, or P0/2. Further, tuning the resonant frequency of the MEMS device 200 was performed, in some embodiments, using the FIB tool to remove mass from the diffractive element 215, thus reducing its moment of inertia and increasing its resonant frequency (FIG. 2B). Removal of about a 5×5×25-μm³ volume of the diffractive element 215 results in about an 80-Hz increase in the driving frequency of applied excitation voltage. The increase in the driving frequency of applied excitation voltage may be between 70-Hz and 90-Hz. The tuning curves (shown in FIG. 2C as a function of the driving frequency) have the characteristic waveform of a nonlinear resonator, with a sharp edge on the low-frequency side. The peak frequency of the tuning curves showed linear shifts with respect to removed volume at the outer edges of the diffractive element (e.g., a MEMS crystal, a silicon crystal, a single crystal micro-mirror etc.). With careful calculations and control of the FIB micromachining, the frequency response of the device (at about a 45-V driving voltage) was shifted. In some embodiments, the frequency response of the device was shifted to a range of 1 kHz to 500 MHz and all subharmonics therein. In some embodiments, the frequency response of the device was shifted to a range of 10 kHz to 400 MHz and all subharmonics therein. In some embodiments, the frequency response of the device was shifted to a range of 352 MHz In some embodiments, the frequency response of the device was shifted to a range of 1 kHz to 500 MHz and all subharmonics therein. In some embodiments the frequency response of the device was shifted to a range from 122.18 kHz to 149.39 kHz and all subharmonics therein. In some embodiments the frequency response of the device was shifted to a range from 124.89 kHz to 146.67 kHz and all subharmonics therein. In some embodiments the frequency response of the device was shifted to a range from 127.61 kHz to 143.96 kHz and all subharmonics therein. In some embodiments the frequency response of the device was shifted to a range from 130.32 kHz to 141.24 kHz and all subharmonics therein. In some embodiments the frequency response of the device was shifted to a range from 133.035 kHz to 138.52 kHz and all subharmonics therein. In some embodiments the frequency response of the device was shifted to the range from 135.75 to 135.81 kHz and all subharmonics therein, which overlaps with the desired frequency of 135.777 kHz or P0/2 (FIG. 2C). Hence, after the tuning process, this group of MEMS are denoted as P0/2 devices. It is also noted here that the method of FIB fine-tuning, together with the design flexibility of MEMS devices, allows for the P0/2 devices to be deployed at different synchrotron facilities worldwide.

Note these FIB machined devices still have the phosphorous dopant-induced strained layers. The static rocking curve was measured when a MEMS device was not energized. The rocking curves of the frequency-matched devices were acquired with conventional θ-2θ scans. An optical beam, in some embodiments a hard x-ray beam, with a photon energy of about 8 keV is used. The optical beam was focused horizontally and confined by a pair of slits to approximately 10 μm×10 μm before impinging onto the center of the diffractive element (e.g., a MEMS crystal, a silicon crystal, a single crystal micro-mirror etc.). A high-precision diffractometer with an angular resolution of $3\times10^{-5}$ degree was used, as the width of the rocking curves is on the order of a few millidegrees (mdeg).

Figure 7A:
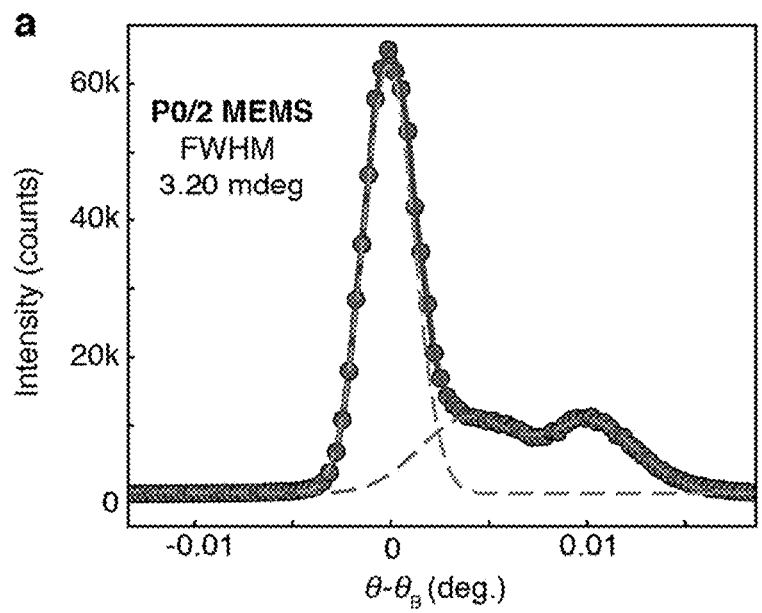
FIGS. 7A-7B show rocking curves of the diffractive element (e.g., a MEMS crystal, a silicon crystal, a single crystal micro-mirror etc.) at the Si (004) Bragg reflection.
Figure 7B:
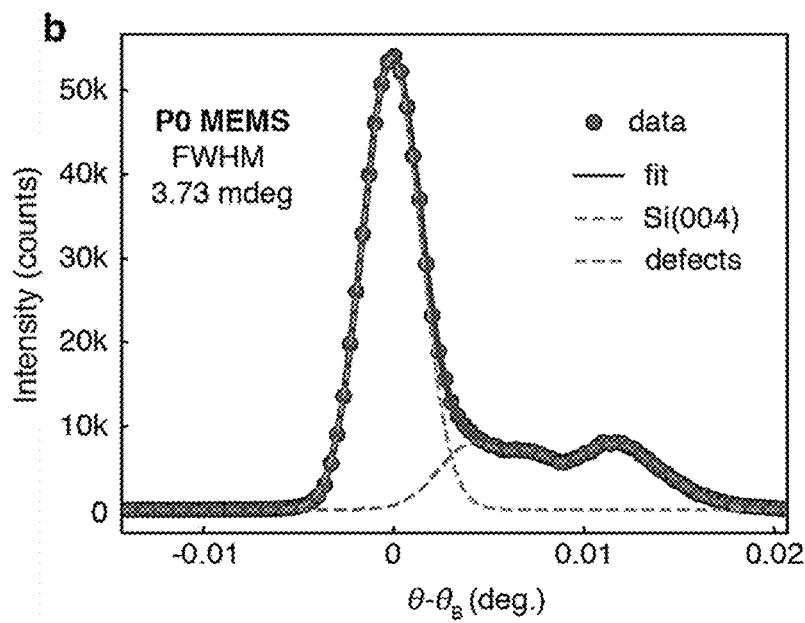

FIG. 7A shows the rocking curve for a typical P0/2 MEMS device measured around the (004) Bragg reflection of the x-ray diffracting silicon mirror. In addition to the strong Bragg reflection with a full width half maximum (FWHM) of about 3.20 mdeg, the defects of the silicon mirror, particularly its doping layers induced during the fabrication process, contribute to a high-angle shoulder. Some of the fastest devices tested are the P0 MEMS devices, with a resonant frequency twice that of the P0/2 devices. In term of the static structure, however, the P0 devices are similar to lower-frequency devices including the asynchronous ones, as all these devices were fabricated using the same fabrication process. A typical rocking curve of about 3.73-mdeg Bragg reflection as well as side peaks at higher angles is shown in FIG. 7B. It should be noted that the side peaks contribute to all the dynamic rocking curve profiles measured in the time domain shown throughout this work. Reducing Diffractive Time Window by Increasing Excitation Voltages.

Per Eq. 1A, to achieve a narrow window with a MEMS device of fixed resonant frequency, the most direct and effective method is to increase the oscillation amplitude, α, by applying a higher excitation voltage. This promises to provide a flexible DTW width from a few nanoseconds (as demonstrated previously) to sub-nanosecond, as described below.

Figure 3A:
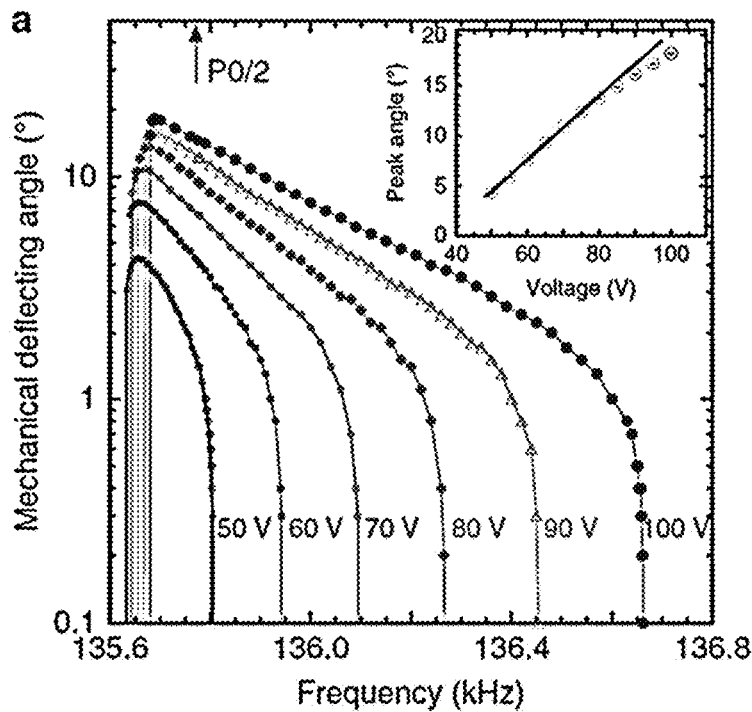
FIGS. 3A-3D show reaching sub-nanosecond diffractive time window by applying high excitation voltage.
Figure 3B:
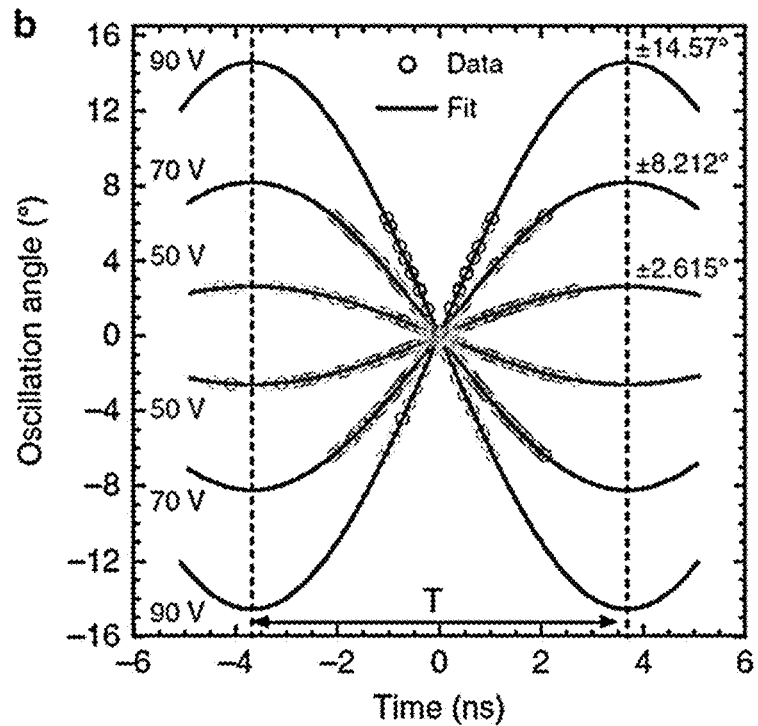

After FIB micromachining, and at about 45-V excitation voltage, the target frequency (P0/2) falls to almost the middle of the tuning curve. This ensures that the MEMS device can oscillate with an amplitude close to the peak values over a wide range of excitation voltage. In FIG. 3A, the tuning curves of the device are shown as the excitation voltage is varied from about 50 V to about 100 V, above its onset voltage of about 40 V. Note that the mechanical deflecting angle is the physical angle that the diffractive element (e.g., a MEMS crystal, a silicon crystal, etc.) oscillates around its flexure from the rest position, which is one-fourth of the MEMS optical scan angle, the widely used figure-of-merit in the MEMS scanner community. Around the onset voltage, a typical vertical comb-drive MEMS actuator has its oscillation angle proportional to the square of voltage. The measurement here covers the medium-to-high voltage region, where the peak amplitude increases almost linearly up to about 80 V, and deviates from the straight line at higher voltages (inset to FIG. 3A). The MEMS oscillation amplitude at P0/2 is measured precisely by the APS X-ray pulse (using 8-keV photons), as shown in FIG. 3B. The measurement was performed with closely packed synchrotron pulses (324-bunch mode at the APS with a bunch interval of 11.37 ns). The angle vs. time plots during one cycle of the 7.365-μs oscillation reveal extremely precise oscillation amplitudes of 14.57° at 90 V, indicating the responsiveness of the MEMS oscillation to the excitation voltage. Parenthetically, this angle corresponds to an astonishing 58.3° optical scan angle at 135.777 kHz, while the peak optical scan angle can be close to 80°, as indicated by FIG. 3A.

Figures 8A, 8B:
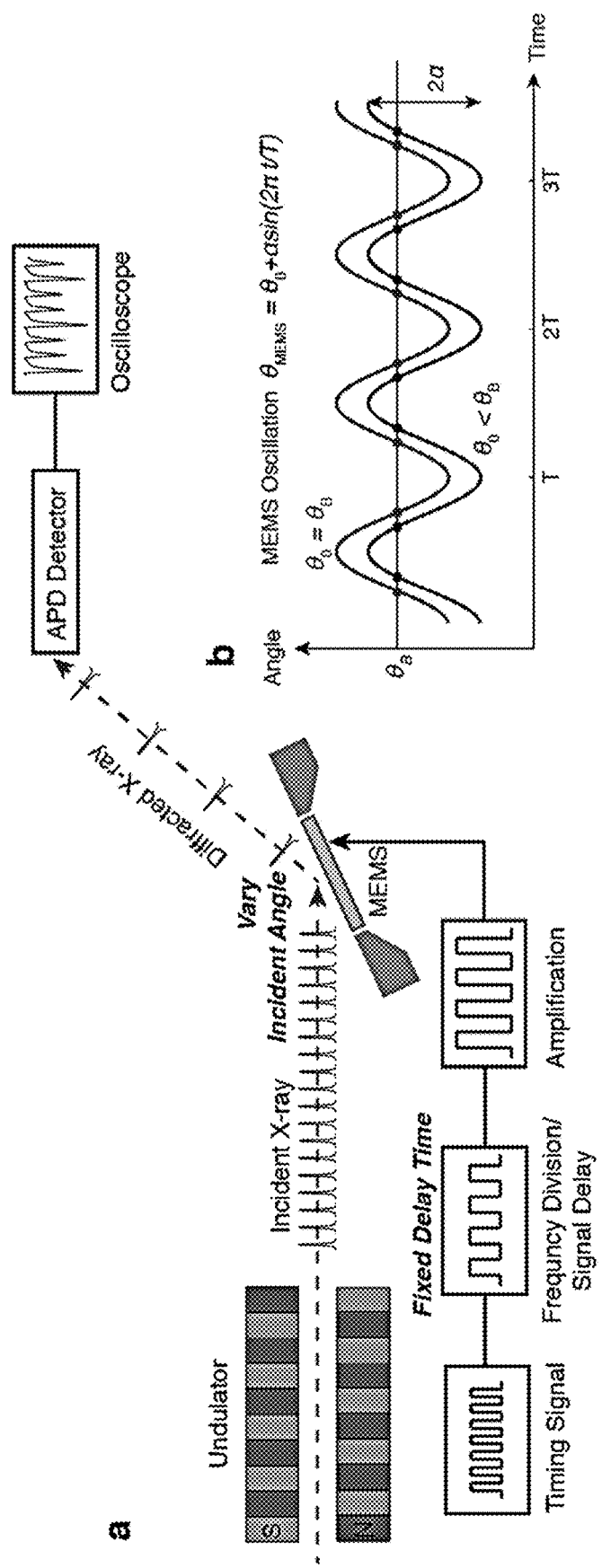
FIGS. 8A-8D show at-wavelength measurement of MEMS resonator oscillation amplitude.

It has been demonstrated that x-ray pulses from the Advanced Photon Source (APS) storage ring can be used to measure the oscillation amplitude of asynchronous MEMS devices by recording the MEMS diffraction wave form. As shown in FIG. 8A, similar metrology can be performed with the frequency-matched MEMS device using high-repetition x-ray pulses, such as those of the 324-bunch mode at the APS. FIG. 8A. depicts a MEMS system 800. The MEMS system 800 includes a controller 840, the MEMS device 200, a detector 820, and a display 830. An undulator is in optical communication with the MEMS device 200 and configured to transmit an optical beam 810 to the MEMS device 200. The MEMS device 200 diffracts the optical beam to the detector 820 as a diffracted beam 815. The detector 820 is electrically connected to the display 830. Additionally, controller 840 is electrically connected to the MEMS device 200.

In operation, an undulator transmits an optical beam 810 to the MEMS device 200. The undulator can be a storage ring, a synchrotron, or any other system configured to transmit optical beams. In some embodiments, the optical beam 810 is an incident x-ray beam. The MEMS device 200 is configured to adjust its position as described above (see discussion of FIG. 2A). As the MEMS device 200 adjusts its position while the optical beam 810 makes contact with the MEMS device 200, the optical beam 810 is diffracted when the MEMS device 200 adjusts to a particular position, as depicted by the diffracted beam 815. In other positions, the MEMS device 200 absorbs and transmits the optical beam 810. In particular embodiments, the optical beam 810 is diffracted as the diffracted beam 815, when the MEMS device 200 operates around the Bragg condition with an oscillation angle $\theta_{MEMS}=\theta_0+\alpha \sin(\omega t)$, where $\theta_0$ is the x-ray incident angle when the silicon element is at its rest position, α and ω (or 2π/T) are the oscillation amplitude and angular frequency, respectively. The diffracted beam 815 is diffracted to a detector 820. In some embodiments, the detector 820 is a customized avalanche photodiode detector. In operation, the detector 820 receives the diffracted beam 815 and transmits the diffracted beam 815 to a display 830. In some embodiments, the display 830 is an oscilloscope 835 configured to graphically display the diffracted beam 815.

As illustrated in FIG. 8B, the Bragg condition is met twice in one oscillation cycle, but the separation between these two times depends on $\theta_0$ of the MEMS device. For example, when $\theta_0=\theta_B$, the separation is half of the cycle, and this is the reason that a MEMS device can pick x-ray pulses at a frequency twice its resonant frequency. When $\theta_0 \neq \theta_B$, the separation alternates between less than and greater than half of the cycle.

Figures 8C, 8D:
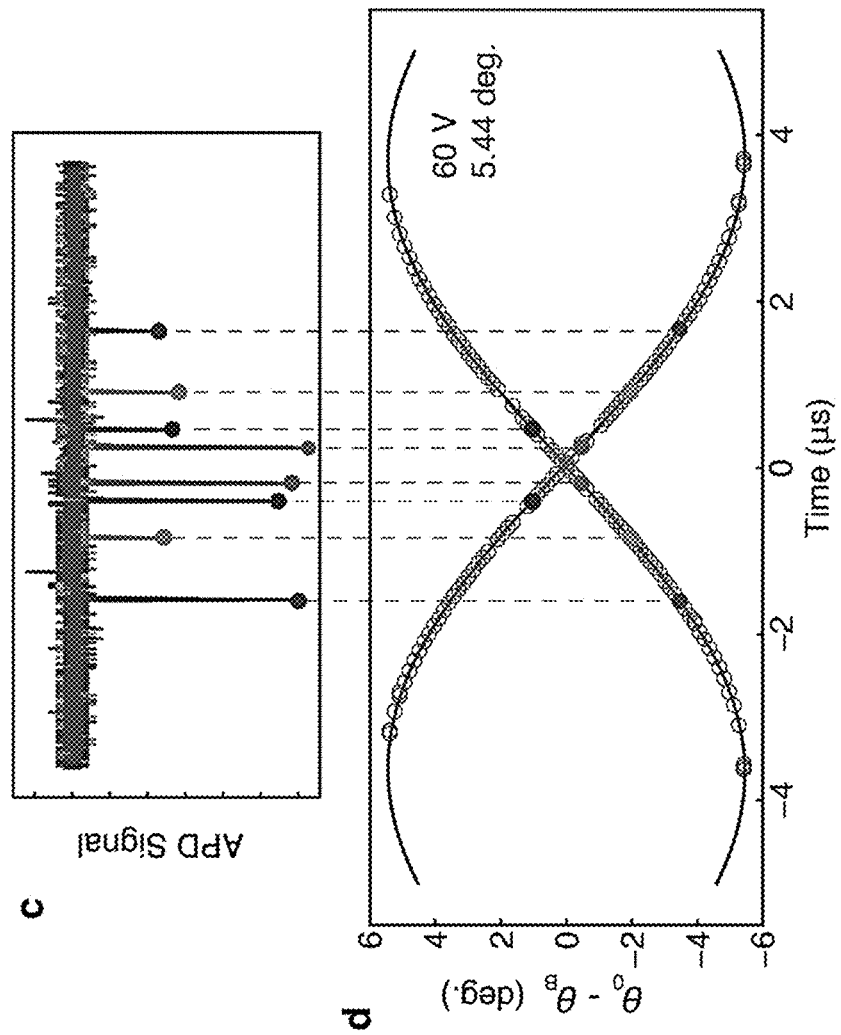

To measure the oscillation amplitude, a series of scope traces of diffracted x-ray pulses are collected (negative voltage pulse from the avalanche photodiode) in real time when the resting position of MEMS devices is varied over a wide range, typically $\theta_3 \pm 5$ degrees. These scope traces are plotted by overlapping the clockwise half-cycles of a MEMS device on top of the counterclockwise ones (FIG. 8C). Peaks in the scope traces represent the instances when an x-ray pulse impinges onto the MEMS element at the Bragg condition. Since the relative position of the peaks depends on the $\theta_0$ of the MEMS device, as mentioned above, the correlation between the peak positions and theta angles yields the oscillation trace $\theta_{MEMS}=\theta_0+\alpha \sin(\omega t)$. FIG. 8D shows $\theta_0$ of MEMS devices plotted against the relative times where x-ray pulses are picked, thus mapping out two branches of the sinusoidal oscillation of MEMS devices. A sinusoidal fit, with known oscillation frequency, determines the exact oscillation amplitude. In this example, shown in FIG. 8C-8D, a P0/2 MEMS device, operated at 60 V, has an oscillation amplitude of 5.44 degrees.

Figure 3C:
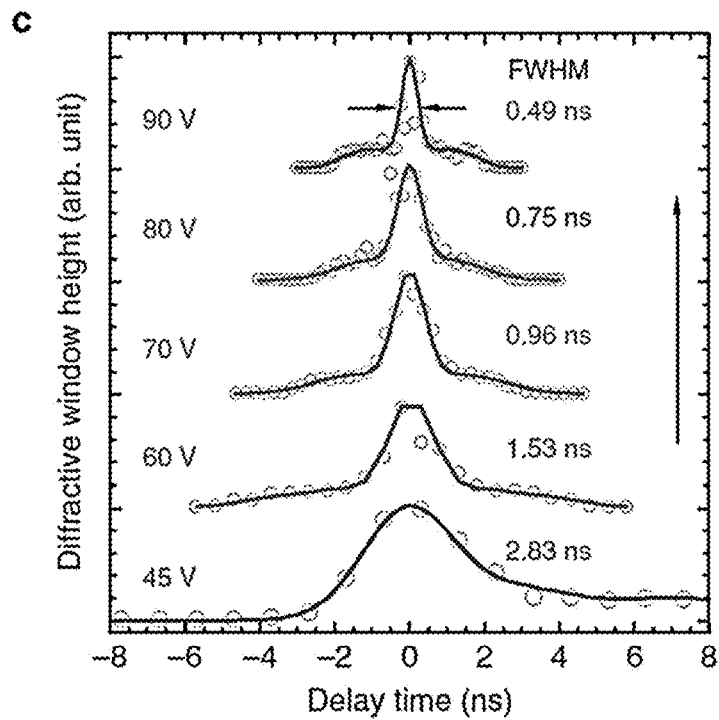

As depicted by FIG. 8A, with the frequency-commensurate MEMS device 200, the determination of the DTW can be efficiently done by means of delay scans with a single, 100-ps-wide synchrotron X-ray pulse, given that the pulse width is narrower than the DTW. To determine the DTW, the controller 840 includes a delayer 842 which transmits a timing signal 845 and command signal 850 to the MEMS device 200. In some embodiments, the delayer 842 transmits the timing signal 845 and the command signal 850 through an amplifier 860 before being transmitted to the MEMS device 200. In some embodiments, the command signal 850 is a frequency division signal. In some embodiments, the command signal 850 is a signal delay command signal. In some embodiments, by transmitting the timing signal 845 and a command signal 850 by the delayer 842, which is a signal delay command signal, the controller 840 is able to vary the phase at which the MEMS device 200 oscillates. By varying the phase of the MEMS device 200 oscillation with respect to a fixed timing signal from the delayer 842, an X-ray pulse samples through the Bragg peak in controlled delay steps so that the window profile is measured with an accuracy of 20 ps. Such delay scans can also be understood as the creation of the dynamic rocking curve of the MEMS element as illustrated in FIG. 1C. With the increase in oscillation amplitude by increasing excitation voltage, the DTW widths decrease steadily, from several ns to just below 0.5 ns at 90V, reaching almost an order of magnitude decrease (FIG. 3C). This is summarized in FIG. 3D, where the plots show the measured DTW widths match the values predicted by Eq. 1, down to 0.49 ns at the highest voltage. It is demonstrated that the MEMS element can effectively manipulate hard X-ray pulses on about a 500-ps time scale, well below the shortest bunch interval at any synchrotron source, which is typically between 2 and 10 ns.

Further, a diffractive time window (DTW) can be measured with a continuous x-ray beam using an x-ray detector with a temporal resolution much shorter than the DTW width. Such high-temporal-resolution x-ray detectors are not readily available. Since an x-ray beam from a storage ring source is pulsed and the pulse width is shorter than current DTWs, one can use temporal delay scans to effectively map out the latter. The delay scans become efficient especially when the MEMS oscillation is frequency-matched to the storage ring so that a high temporal resolution without recourse to a fast x-ray detector can be achieved. When the phase difference between the MEMS oscillator and an x-ray pulse is varied, the particular x-ray pulse from the storage ring samples through the DTW of the MEMS device element.

Figure 9A:
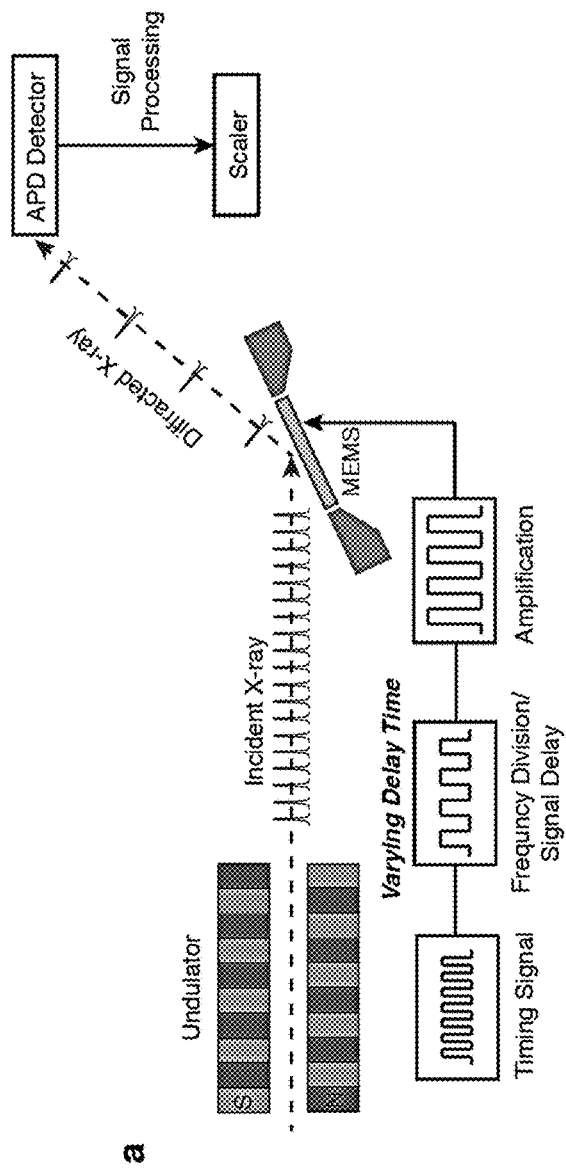
FIGS. 9A-9C illustrate measuring the dynamic rocking curve by delay scans.

Experimentally, the measurement was performed using the setup shown in FIG. 9A, at beamline 7-ID of the APS. FIG. 9A shows an alternate MEMS system 900. The MEMS system 900 is connected and operates similarly to the MEMS system 800 described above and in FIG. 8A. However, in the MEMS system 900, the display 830 is a scaler 910. Further, in operation, the detector 820 transmits the diffracted beam 815 to the scaler 910 after the diffracted beam 815 passes through signal processing 905. In particular, the scaler 910 receives a processed signal and is able to display the intensity of the diffracted beam 815.

Figure 9C:
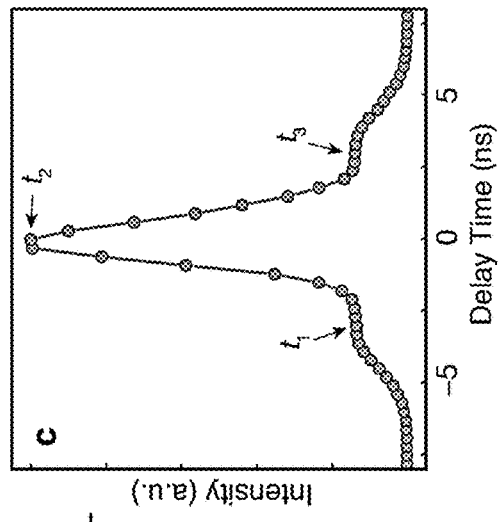
Figure 9B:
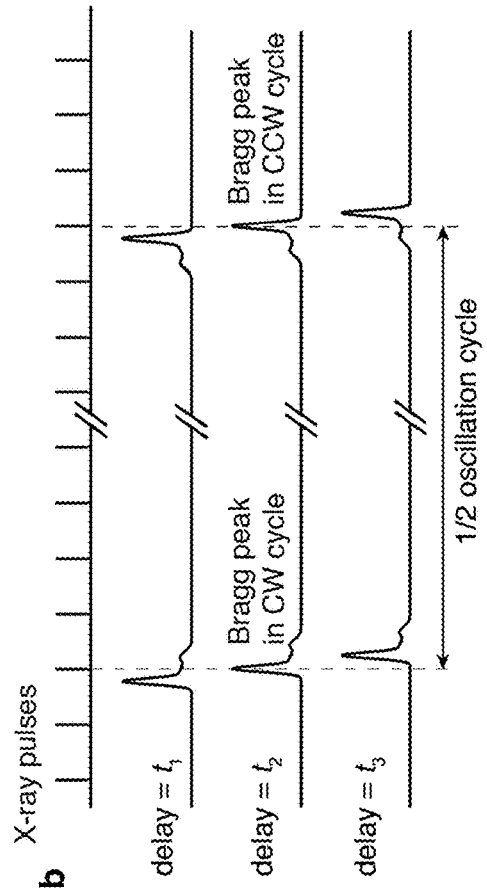

Further describing the MEMS system 900, the exciting voltage pulse for the MEMS device 200 is synchronized to the undulator optical beam, the phase of the MEMS device 200 oscillation can be adjusted with a controller 840. In some embodiments the controller 840 is a delay generator in the driving circuit. To measure a DTW profile, the resting position of the MEMS device 200 is set at the Bragg angle respective to the x-ray beam. Once the MEMS device 200 starts to oscillate, the Bragg condition is met twice in one cycle: one each during the first and the second half-cycle. These two dynamic rocking curves in the time domain have opposite waveforms since the MEMS device 200 rotates in opposite directions across the Bragg conditions. The rocking curves in the time domain are recorded by a detector 820, which does not need to be particularly fast (FIG. 9A). In some cases the detector 820 is a counting detector such as a customized avalanche photo diode detector. When the resting position of the MEMS device 200 is set at the crystal Bragg angle, the two dynamic rocking curves are separated by exactly half of the oscillation cycle, as illustrated in FIG. 9B. With a zero delay time, when the first dynamic Bragg peak in the cycle coincides with an x-ray pulse, the second dynamic Bragg peak will coincide with another x-ray pulse half an oscillation cycle away, as shown in FIG. 9B. By stepping through a series of delay times, a pair of x-ray pulses map out the entire time-domain rocking curve (or DTW). Since the detecting circuit cannot discriminate between the two rocking curves in one oscillation cycle, a scanned rocking curve shows "mirror-imaged" features (FIG. 9C) from the static rocking curve, including the dopant-induced strain peaks above the Bragg peak at later (earlier) times for increasing (decreasing) angles.

To evaluate the quality of the diffracted beam 815 by the MEMS device 200, the diffracted beam spatial profiles were measured in the diffraction plane when the MEMS devices were static or oscillating, as they are compared with the incident beam spatial profile. With frequency-matched MEMS devices, a sub-nanosecond DTW for temporal manipulation of synchrotron x-ray pulses is achieved while maintaining the spatial profile of incident x-ray beam when the device is rapidly oscillating. This is demonstrated as follows. The sample was mounted on a 6-circle diffractometer where the sample-to-detector distance was 1.10 m and 2-theta scans with a fine slit (about 10 μm) were performed to profile the incident beam (without the presence of the MEMS device) and the diffracted beams when the MEMS was static at the Bragg angle or oscillating about the Bragg angle.

Figure 10A:
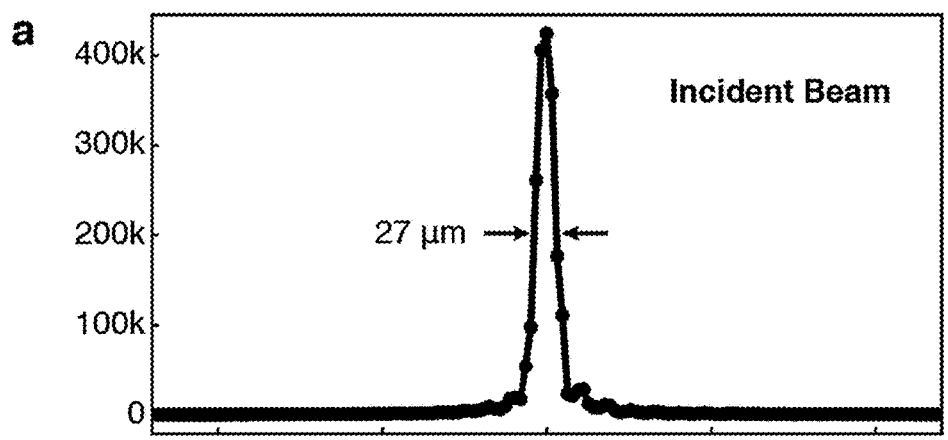
FIGS. 10A-10C show measurement of the beam spatial profile.
Figure 10B:
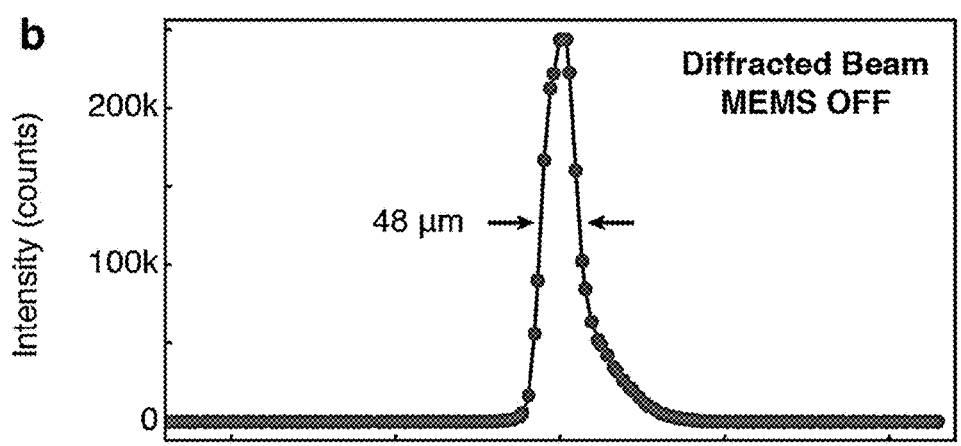
Figure 10C:
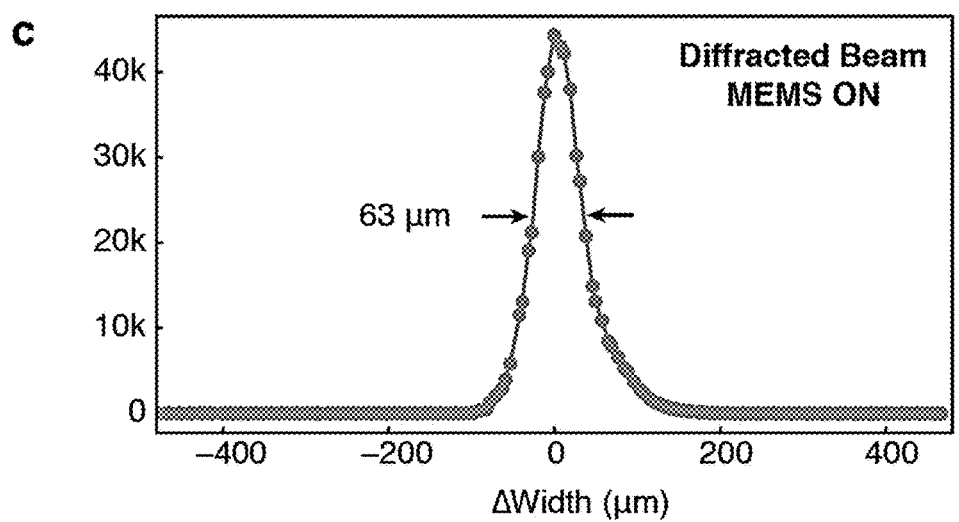

FIGS. 10A-10C shows the beam-profile measurements by scanning the detector with the fine slit. The incident x-ray beam, confined to 6 μm by beam-defining slits located 20-cm upstream of the diffractometer, was enlarged to about 27 μm FWHM due to coherent scattering from the slits. In comparison, the x-ray beam diffracted off the surface of the static MEMS (FIG. 10B) was measured to be 48 μm FWHM using a 2-theta scan. This broadening was primarily due to the presence of a doped layer that introduced defects in the x-ray diffracting MEMS element, as discussed above. It is expected that the diffracted beam will be further improved with modified fabrication methods removing the doping layers. When the device was turned on and the diffractive element (e.g., a MEMS crystal, a silicon crystal, a single crystal micro-mirror etc.) oscillated rapidly, the beam size became sensitive to distortions of the diffractive element at an angular speed >$10^6$ degrees $s^{-1}$ as well as any timing jitter in the system. It is thus remarkable that the diffracted beam was only slightly broadened to about 63 μm in the oscillating case (FIG. 10C).

These measurements confirm that the MEMS devices serving as x-ray optics can pass the x-ray beam profile downstream with a profile acceptable for practical x-ray studies. Here note that the quality of the spatial profile of the diffracted beam remains high. While the diffraction efficiency is about 95% (with over 10 sampling points), the dynamic diffracted beam was broadened spatially by only about 20% compared to when the diffractive element is static (off). This degradation of diffracted beam quality is expected to be mitigated by the MEMS without the surface doping produced in future dedicated MEMS fabrication runs. In addition, with monochromatic X-ray beams, beam heating effect on the diffracted beam quality is negligible. The MEMS devices are designed to manipulate synchrotron x-rays and are required to sustain significant x-ray dose without degradation of their performance. The calculation was performed in the vicinity of the Bragg condition for an incident beam with a flux of $10^{11}$ photon/s. At current and future synchrotron sources, the intensity of a monochromatic, collimated beam on the order of $10^{11}$ photon/s between 8 to 14.4 keV will result in 23 to 61 μW of absorbed power, as shown in Table 1B. Due to the excellent thermal conductivity of silicon, the MEMS devices will maintain their structural and mechanical characteristics under this level of x-ray dose. Neglecting convection and other potential sources of heat transfer, if the energy deposited by the x-rays is transported out of the rotating MEMS crystal solely by conduction through the torsional springs, the upper limit of the steady-state temperature rise is calculated to be about 0.28 K for a beam flux of $10^{11}$ photons/s at 8 keV.

TABLE 1

Estimate of x-ray absorbed power by a MEMS device.

| Energy (keV) | 8.0 | 10.0 | 12.0 | 14.4 |
|---|---|---|---|---|
| λ (wavelength) (Å$^{-1}$) | 1.55 | 1.20 | 1.01 | 0.861 |
| Effective thickness (μm) | 45.3 | 56.6 | 67.9 | 78.9 |
| Absorption | 0.478 | 0.345 | 0.257 | 0.182 |
| Absorbed Power (μW) | 61.2 | 55.2 | 49.3 | 23.3 |

Figure 11A:
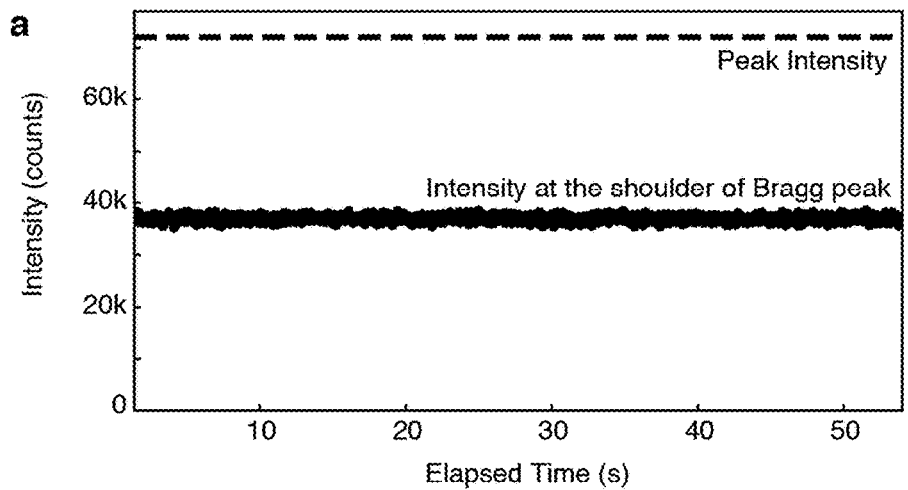
FIGS. 11A-11B illustrate thermal stability of MEMS devices under monochromatic hard x-rays.

Further, the thermal stability of the MEMS devices under monochromatic hard x-rays is demonstrated. For these measurements, an x-ray beam with flux of the order $10^{10}$ photons/s at 8 keV (approximately 6 μW of absorbed power) is used. Two measurements were conducted. First, the diffracted intensity at the middle point of the rising edge of the rocking curve, where it is most sensitive to peak shift, was monitored. If x-ray beam-induced heating was significant, it would cause lattice expansion, shift the peak to lower angles, and increase the intensity at the shoulder. FIG. 11A shows that after the x-ray shutter was opened at t=0, the intensity at the shoulder remained constant over about 50 s without an intensity increase.

Figure 11B:
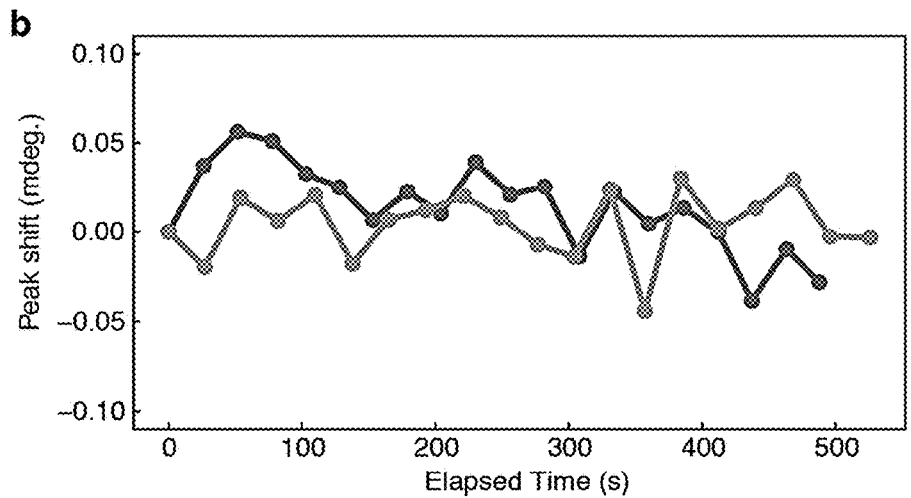

In the second experiment, a series of static rocking curves were acquired to monitor the peak position after the x-ray shutter was opened at t=0. The curves shown in FIG. 11B display relative peak shifts for two series of measurements, one scanning θ low to high and the other high to low, to guard against systematic errors. The peak shifts in FIG. 11B are negligible within the experimental resolution and show no measurable heating trend. Specifically, the average peak shift is 0.024±0.024 mdeg at time 50-150 s, and −0.004±0.02 mdeg at time 410-520 s. For reference, a 1-K temperature rise corresponds to approximately a −0.1 mdeg shift. Similar measurements also showed no measurable heating at lower x-ray fluxes.

In addition to addressing the beam heating effect under monochromatic x-ray beam, the stability of a MEMS device under a much higher x-ray dose using white-beam measurement was investigated. The measurement was carried out in x-ray imaging beamline at 7ID-B of APS. The incident white x-ray beam has a power of about 400 W and a center photon energy of 11.6 keV. A mechanical shutter, which opens about 15 ms in every 1 s, was used to modulate the white beam and cut off of about 98.5% of the incident power. Also considering that the white beam (1 mm×1 mm) is much larger the diffractive element (e.g., a MEMS crystal, a silicon crystal, a single crystal micro-mirror etc.), it is estimated that the power of x-ray beam impinged on the device is on the order of about 10 mW, two orders of magnitude higher than the monochromatic case discussed above. Additionally, over the course of several hours, the device can still operate continuously without apparent degradation under the 10 mW absorbed power. Regarding the application of MEMS devices at high-rate FEL sources, similar modulation devices are expected to be required to limit a long exposure of devices to FEL beam.

Figure 3D:
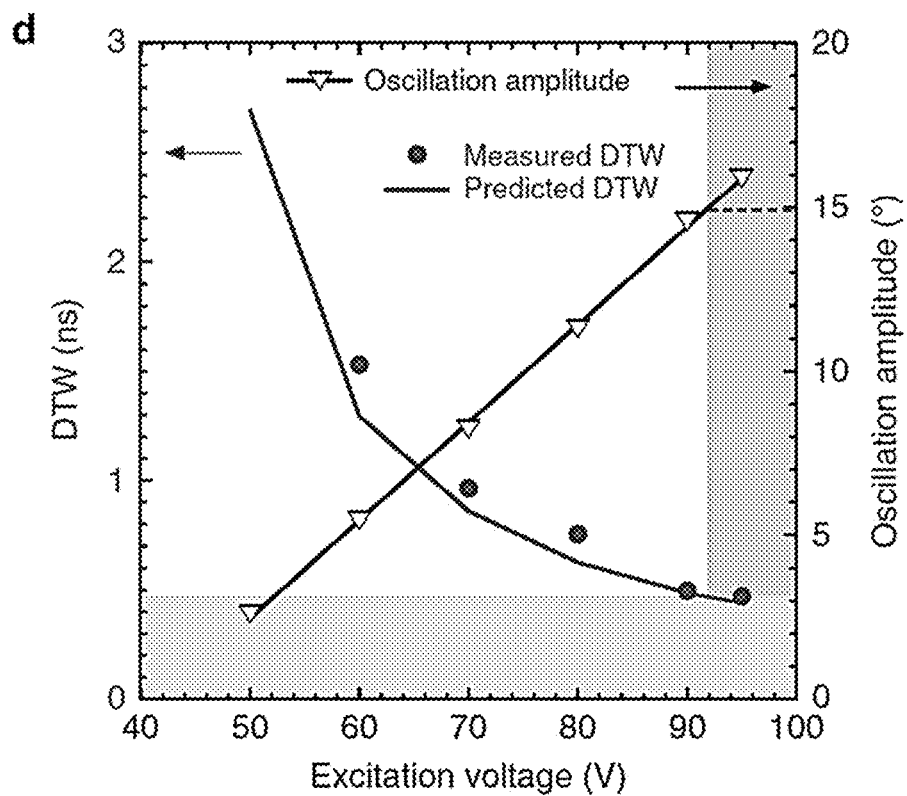

In FIG. 3D, the MEMS deflection angle at about 135.777 kHz increases linearly with the excitation voltage. Using a higher excitation voltage alone to achieve a narrow DTW, however, has its limitations. With planar comb drives, the maximum oscillation amplitude is set by a pull-in phenomenon where the rate of electrostatic force starts to exceed the mechanical restoring torque, leading to unstable oscillation. In the pull-in-free region, the maximum angle based on the geometry of the MEMS device can be estimated. In some embodiments, the maximum angle is 20.3°. As shown in FIGS. 3A-3D, the amplitude has already exceeded 15° at 90V, hence there is little room for further improvement. The calculated limit agrees well with the experiment as the measured amplitude saturates around 20° above 100 V. The mechanical limit of the MEMS device where a large oscillation amplitude leads to fracture failure of the device is estimated. In some embodiments, the mechanical limit is about 40° (substantially beyond the measurement range) due to the excellent mechanical properties of silicon. In addition to a limited oscillation amplitude, at the high excitation voltages the tuning curve becomes significantly broadened, indicating lower Q factors (FIG. 3A) and higher energy dissipation. Therefore, it becomes impractical to rely on exciting the MEMS using a higher voltage (power) to achieve even narrower DTW (yellow shaded area in FIG. 3D).

An estimation of maximum deflection angle before fracture failure can be made. As seen in the MEMS device frequency response and oscillation amplitudes vs. driving voltage, the dynamic amplitudes show linear increases in amplitude even though static displacement vs. voltage is a quadratic relationship. This can be attributed to the increased dynamic damping of the device at larger velocities with increased oscillation amplitude. Although the MEMS device can be driven to very large amplitudes, resulting in stresses approaching and beyond the silicon yield strength at the flexures, this device ultimately stops oscillating before failure, at voltages above 100 V. This is likely due to the fundamental mode of operation being unsustainable due to the large forces applied on the comb drives, which cannot be supported by the dynamically deforming flexures.

Figure 12A:
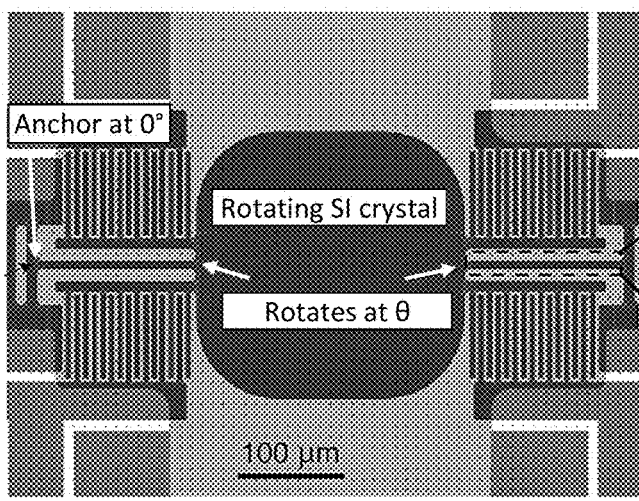
FIGS. 12A-12B show a model of fracture failure of MEMS devices.
Figure 12B:
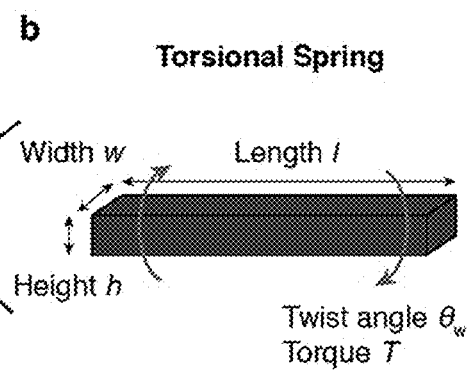

The angle at which the MEMS device is subject to fracture failure is estimated. As shown in the drawing in FIG. 12 and described in FIG. 2A, the diffractive element (e.g., a MEMS crystal, a silicon crystal, a single crystal micro-mirror etc.), serving as an x-ray diffraction element, is connected to two sets of torsional actuators, in some embodiments, comb drives with a set of torsional flexure arms, in some embodiments, torsional springs. In the example embodiment, one end of the torsional spring is anchored at 0° by the frame. At a rotation angle of θ, the end of the torsional spring connecting to the diffractive element is thus twisted by an angle of θ. In this case, the torsional spring has the largest mechanical stress and will be the first part to fail.

In some embodiments, the torsional spring is modeled as a homogenous silicon bar under a torque T acting normal to the axis (e.g. the oscillation axis 217 as depicted in FIG. 2A) of the bar at both ends. In some embodiments, the torsional spring may be formed from silicon, silicon carbide, silicon germanium, germanium or any other material used for enduring torque. In some embodiments, dimension of the spring is about 5 μm in width w, about 25 μm in height h, and about 150 μm in length l. In some embodiments, the dimensions of the spring is a range, the height h between 15 μm and 35 μm, the width w between 15 μm and 35 μm, the length l between 15 μm and 35 μm. Both ends of the silicon bar are twisted by $θ_w$, but along opposite directions. The twist angle $θ_w$ is half of the rotation angle θ of the rotating Si crystal, so that the mechanical boundary is equivalent to what is assumed above. The shear stress τ at a distance r from the axis of rotation is:

$$\tau = \frac{Tr}{J} = \frac{Gθ_w r}{l}, \text{ and } T = \frac{Gθ_w J}{l} \quad (3)$$

where J is the torsional constant or the second moment of inertia, and G is the shear modulus. The maximum shear stress is at the outermost surface of the mid-point of the torsional spring, where r reaches maximum. The spring fails when the maximum shear stress reaches or exceeds the fracture strength $σ_{fr}$ of silicon. Rearranging Eq. 3 gives a maximum twist angle as:

$$θ_{max} = \frac{lσ_{fr}}{Gr_{max}} \quad (4)$$

For a rectangular-shape spring, $r_{max}$ is about 12.75 μm, and the shear modulus of [001]-orientated silicon is 79.6 GPa[4]. The fracture strength for single-crystal silicon is usually quoted as 6.9 GPa[5], however a more practical value is in the range of about 2.0-3.0 GPa measured in operando in similar designs of MEMS devices. Using a fracture strength of 2.5 GPa, the maximum twist angle for MEMS devices is about 21.1°, corresponding to a maximum oscillation amplitude of about 42.2°.

As seen in Eq. 1, the most challenging technical requirements in developing dynamic X-ray optics are simultaneously achieving large-amplitude and high-frequency operation using the MEMS torsional oscillators, as well as retaining the X-ray diffraction quality of the diffractive element (e.g., a MEMS crystal, a silicon crystal, a single crystal micro-mirror etc.). MEMS devices have demonstrated frequencies of 100 MHz to 10 GHz in timing applications where the oscillation amplitude is not a part of the design merit. On the other hand, large deflecting angular amplitude devices have been developed for displays, optical scanners, and other beam steering applications. Most of these applications are limited by the requirements of other essential parameters, which do not require high oscillation frequency. The devices require simultaneous optimization of both parameters: frequency and amplitude of the torsional devices. In addition to reducing DTW of the X-ray MEMS devices, higher resonant frequency, f, also improves the efficiency of X-ray delivery since the synchronized high-frequency devices have a greater duty cycle.

Higher-Frequency MEMS Oscillators Operated in Vacuum Environment.

Figure 4A:
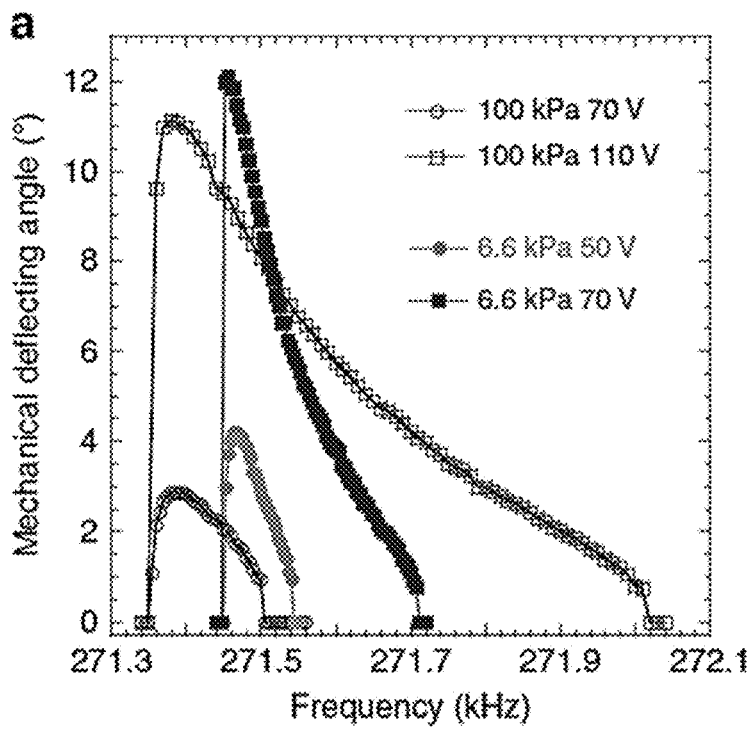
FIGS. 4A-4F show performance of higher-frequency (P0) MEMS resonators operated in vacuum.

The MEMS devices were designed with higher frequency and addressed the challenge to maintain a large oscillation amplitude. In some embodiments, these MEMS devices, after FIB-based tuning, operate at the higher frequency of 271.555 kHz, the same as the APS storage-ring frequency, denoted as P0 devices. However, when operating in air, the P0 devices have a much higher onset excitation voltage of 70 V, compared to lower-frequency devices (e.g., about 40 V for the P0/2 devices). To obtain an oscillation amplitude above 10°, the excitation voltage must be as high as 110 V (as shown in FIG. 4A) with very high-level power consumption. The requirement of higher excitation voltage is due to the increased stiffness of the torsional flexure and significant fluid dynamic damping by the presence of air surrounding the rapidly oscillating devices whose angular velocity is close to $10^7$ degrees $s^{-1}$. The interaction of the surrounding fluid (air) with the vibrating structure leads to energy dissipation, adversely affecting the oscillation amplitude and Q factor.

Figure 4B:
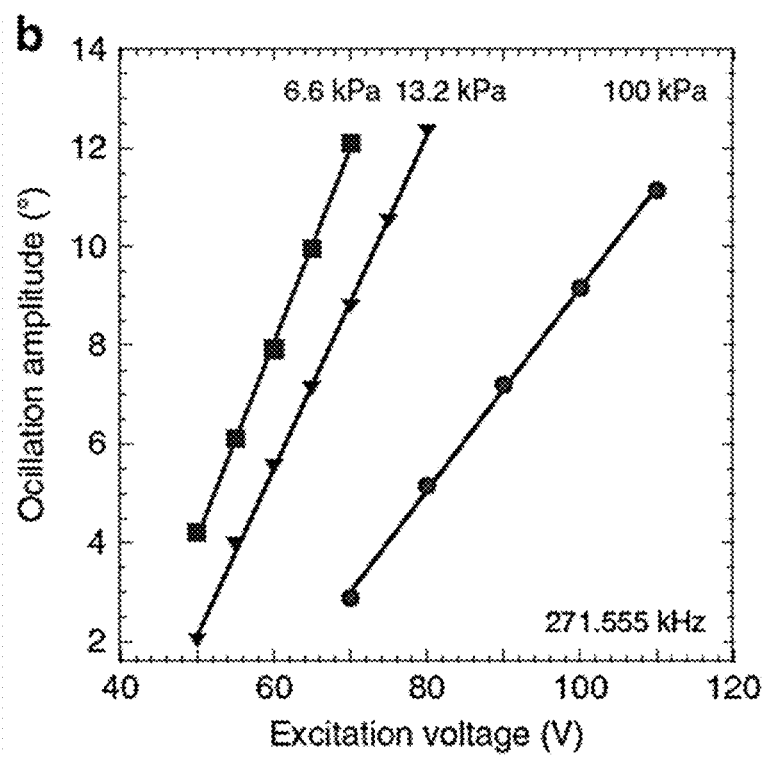
Figure 4C:
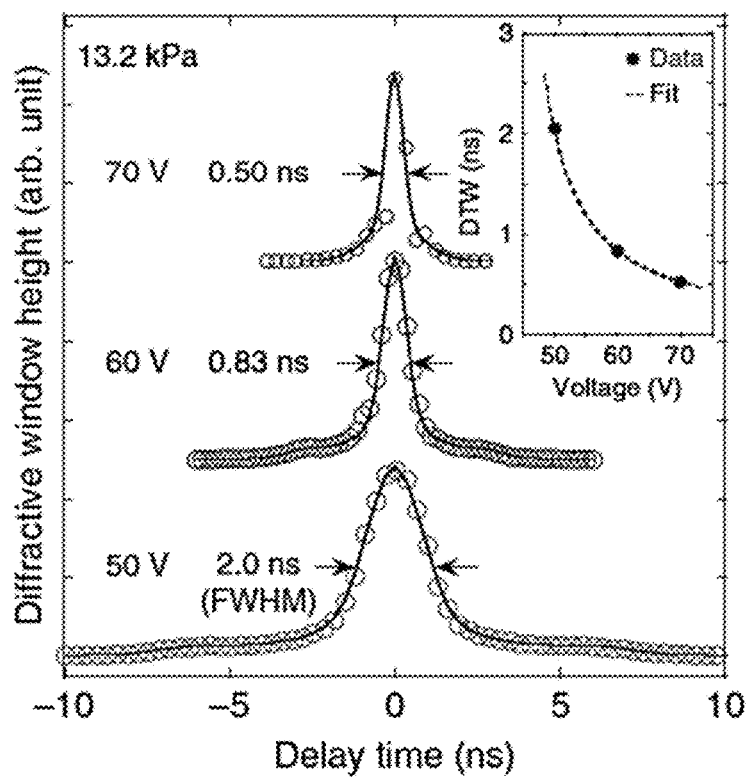

In-vacuum operation greatly reduces the required excitation voltage of MEMS devices. Even in a moderate vacuum environment of about 6.6 kPa, as shown FIG. 4A, the P0 device starts to oscillate at a much lower voltage of about 40 V. At about 50 V, the maximum amplitude is above 4°. When the excitation voltage was increased to about 70 V (the same as the onset voltage in air, 100 kPa), the amplitude reached 12°, corresponding to a maximum angular velocity of 1.03× $10^7$ degrees $s^{-1}$. In addition, the Q factor, estimated from tuning curves with similar maximum amplitudes, was improved by a factor of about 2.5 in the reduced pressure of about 6.6 kPa. The dependence of the amplitude on excitation voltage at atmospheric (100 kPa) and reduced pressure conditions (13.2 and 6.6 kPa) is summarized in FIG. 4B. At all pressures, the relationship is simply linear in the measured range, but the 6.6-kPa data have a slope almost twice as much as the 100-kPa case. This increase of sensitivity to the excitation voltage at lower pressures can be explained by the improvement of Q factors due to lower energy dissipation. At 13.2 kPa, the voltage dependence of the MEMS diffractive window was measured again using the delay scan method. When the excitation voltage increased from about 50 to about 70 V, the DTW steadily narrowed, from 2.0 ns at 50 V to 0.5 ns at 70 V (FIG. 4C). The decreasing DTW widths can be fit with a simple inverse relationship with the voltage shown in the inset to FIG. 4C, confirming the linear dependence of the amplitude on the excitation voltage. It is noted that even in reduced pressure conditions, simply driving up the voltage will have a lessening effect on the reduction of DTW at higher voltages. Therefore, in certain applications it is important to explore the effect of reduced pressure on the MEMS operational characteristics.

Figure 13:
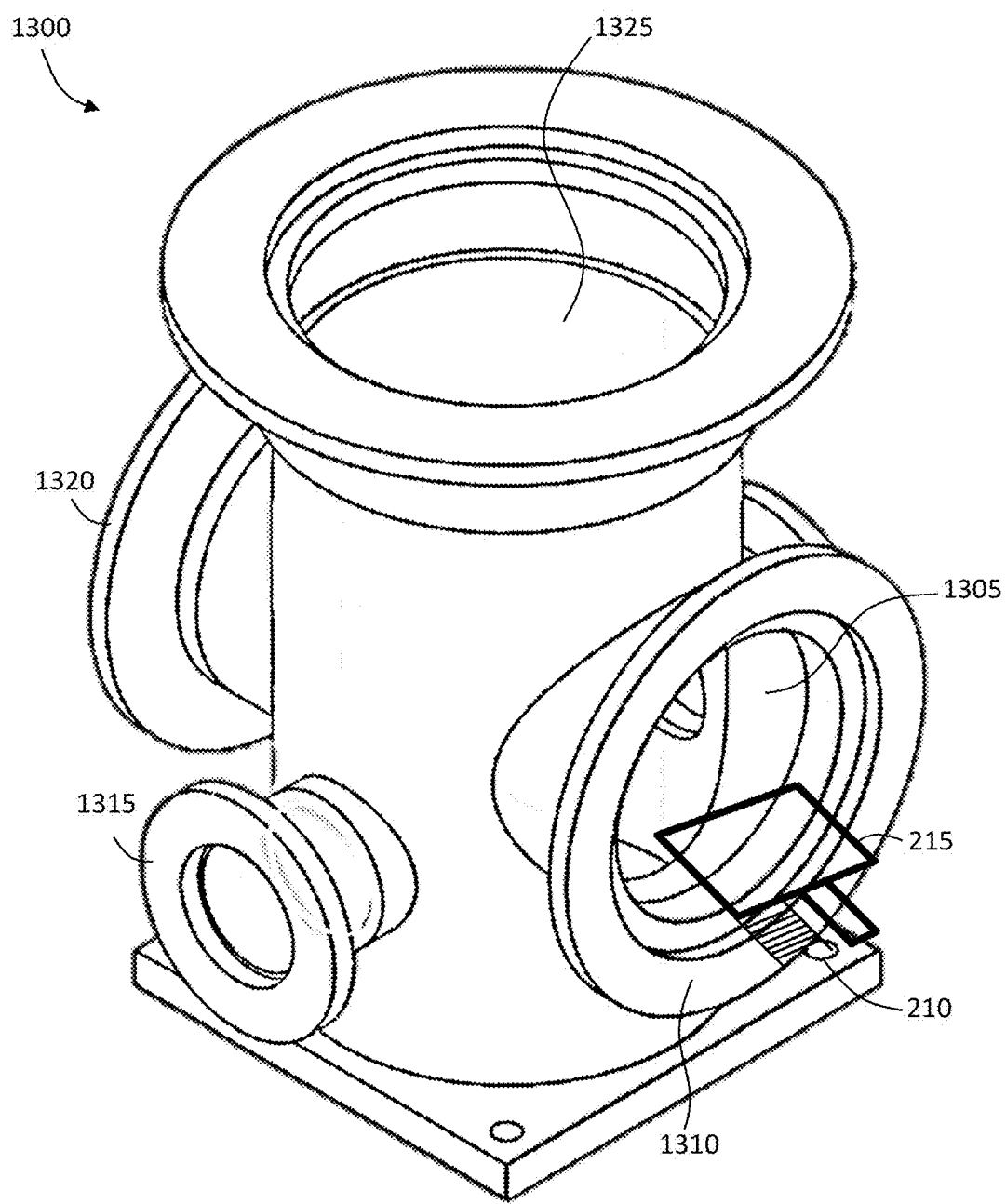
FIG. 13 shows a model of the vacuum chamber used to tune the MEMS device.

FIG. 13 shows how to tune the MEMS device through a vacuum tuning method. Here, the MEMS device, in some embodiments the diffractive element 215 and the at least one torsional actuator 210 is placed within a chamber 1300. The chamber 1300 includes an inner volume 1305, an optical beam in window 1310, an optical beam out window 1320, an electric feed through 1315, and an optical window 1325.

In operation, the diffractive element 215 and the at least one torsional actuator 210 of the MEMS device is placed within the inner volume 1305. The chamber 1300 is then sealed and is pressurized at a pressure lower than at atmospheric pressure (100 kPa). The pressure lower than at atmospheric pressure is in a pressure range from 90 kPa to 2 kPa, all inclusive. In some embodiments, the pressure lower than at atmospheric pressure is in a pressure range from 80 kPa to 4 kPa, all inclusive. In some embodiments, the pressure lower than at atmospheric pressure is in a pressure range from 70 kPa to 6 kPa, all inclusive. In some embodiments, the pressure lower than at atmospheric pressure is in a pressure range from 59.2 kPa to 6.6 kPa, all inclusive. In further operation, an excitation voltage is applied to the diffractive element 215 and the at least one torsional actuator 210 using the electric feed through 1315. An undulator is used to transmit an optical beam to the diffractive element 215 and the at least one torsional actuator 210 as described in FIG. 8A. The optical beam is received by the diffractive element 215 and the at least one torsional actuator 210 through the optical beam in window 1310. The diffractive element 215 and the at least one torsional actuator 210 diffract the optical beam when the diffractive element resonant frequency is nearly the same as the resonant frequency of the optical beam, as described in FIG. 2A, through the optical beam out window 1320. In some embodiments the optical window 1325 is utilized when the optical beam is a form of laser.

Figure 4D:
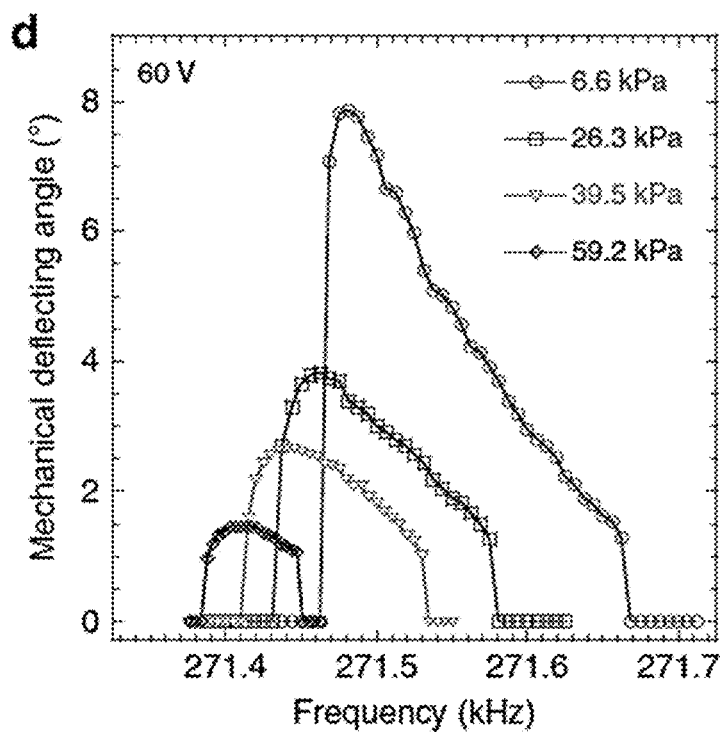

Here, the chamber 1300 is used to tune the frequency because the reduction of fluid damping at lower operating pressure can increase the MEMS oscillation amplitude and frequency dramatically. FIG. 4D shows tuning curves of the MEMS device, for example the P0 device, operated in a pressure range at a pressure lower than atmospheric pressure.

Figure 4E:
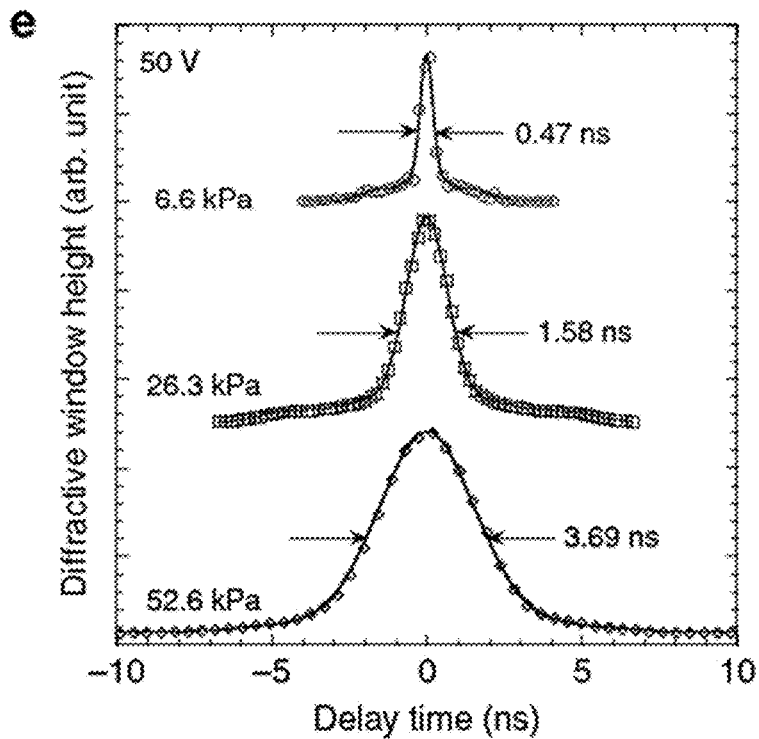
Figure 4F:
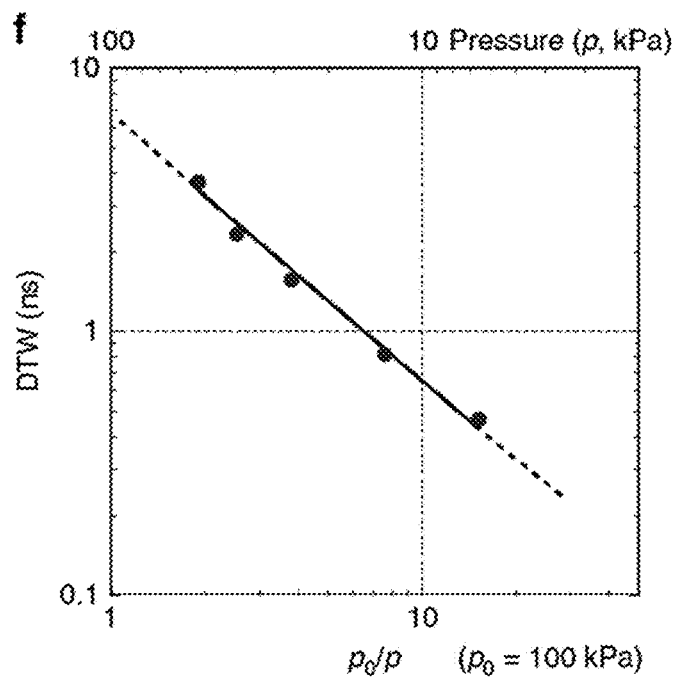

Also, as shown in the tuning curves in FIG. 4D, at a moderate excitation voltage of 60 V, the onset pressure is about 59.2 kPa, at which the amplitude was about 1.45°. At the excitation voltage of 60 V and an onset pressure of about 59.2 kPa, the frequency of the diffractive element was about 271.4 kHz. This was obtained by setting the chamber 1300 to an onset pressure of about 59.2 kPa. In some embodiments, the excitation voltage is between 50 V and 100 V and the frequency is between about 265 kHz and about 280 kHz, all inclusive. In some embodiments, the excitation voltage is between 60 V and 90 V and the frequency is between about 271.4 kHz and 278 kHz, all inclusive. In some embodiments, the excitation voltage is between 70 V and 80 V and the frequency is between 273 kHz and 275 kHz, all inclusive. The tuning curve spans only a 50-Hz frequency range. Further, reduction of the pressure to about 6.6 kPa in the chamber 1300 with an excitation voltage of about 60 V, resulted in a much higher amplitude of 7.86° and a frequency of about 271.6 kHz for the diffractive element resonant frequency which is nearly the same as the resonant frequency of the optical beam. Note that the tuning curves shift to higher frequencies when pressure decreases, indicating that the operating pressure can be another parameter to precisely tune the resonant frequency of the MEMS. The increase of the amplitude is also observed with the DTW measurement by the X-ray delay scans shown in FIG. 4E. The FWHM of the DTW decreased from 3.69 ns to 0.47 ns over the pressure drop. FIG. 4F shows that the DTW drop maintains a precise power-law relationship with the pressure drop in this coarse vacuum condition. Extrapolation of this relationship suggests a further reduction of DTW is possible at even lower pressures.

Achieving a Diffractive Time Window of 100 ps to 300 ps.

The MEMS system described herein beneficially provides a DTW within a range of 100 ps to 2 nanosecond (ns), inclusive (e.g. 100 ps, 200 ps, 300 ps, 400 ps, 500 ps, 600 ps, 700 ps, 800 ps, 900 ps, 1 ns, 1.2 ns, 1.4 ns, 1.6 ns, 1.8 ns, 2 ns). In some embodiments, the DTW is about 300 ps.

Figure 5A:
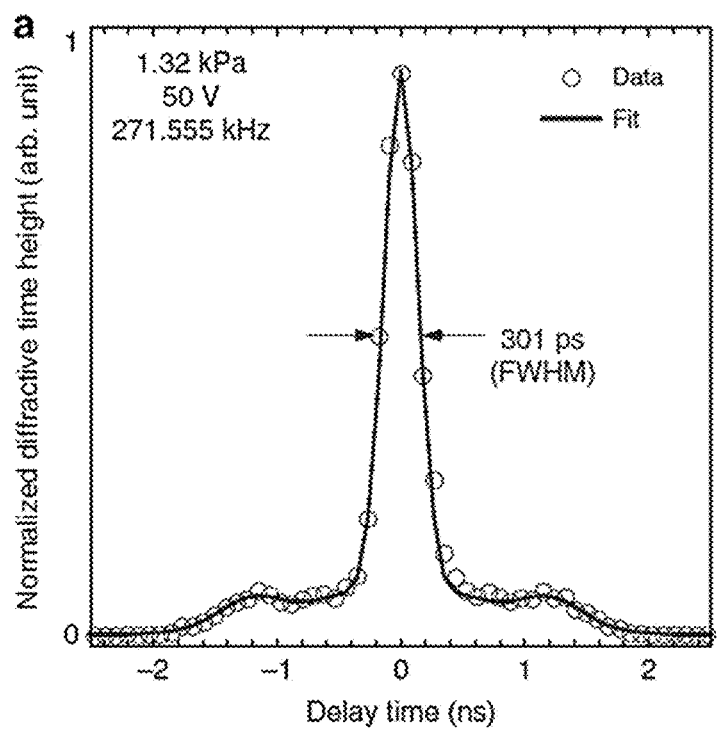
FIGS. 5A-5B show a demonstration of 300-ps diffractive time window.
Figure 5B:
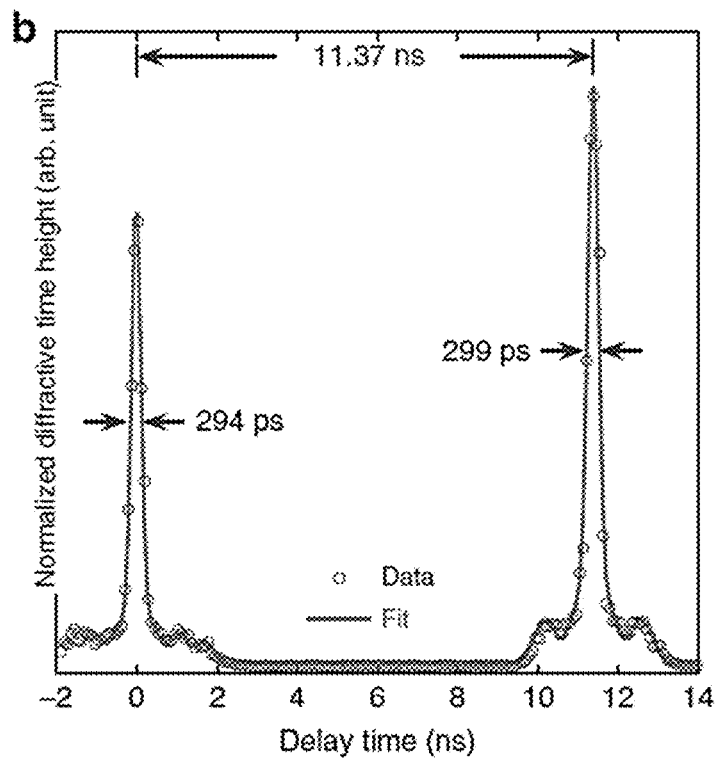

For example with a similar P0 device, at an even lower excitation voltage of 50 V, and in a 1.32-kPa pressure environment, the device's DTW width (FWHM) reduced to about 301±6 ps (FIG. 5A). The scan was performed using an APS X-ray pulse from the 324-bunch timing mode, where 324 singlets, each with nominally the same charge, are uniformly spaced in the storage ring. The spacing between the singlets is 11.37 ns with a normal pulse width of 51 ps FWHM (the storage-ring operation modes available at https://ops.aps.anl.gov/SRparameters/node5.html). The spacing between the DTW peaks was measured to be 11.37±0.004 ns (FIG. 5B), agreeing well with the storage-ring parameter. Over this relatively long delay scan (covering a 16-ns range), which took ca. 235 s in real time to accomplish, the DTW widths determined by scanning through the two adjacent pulses were 294 and 299 ps, respectively. The pulse spacing can be utilized as an external clock to calibrate the delay time if there is timing jitter and/or phase drift in the MEMS operation. In this case, no correction or calibration was needed to obtain the X-ray pulse spacing and the DTW widths. The other observation is that the diffractive window heights revealed the relative charge variation in the bunches. Although all 324-bunch charges are nominally the same in the storage ring, the actual charge is measured to vary by up to 50%, as determined by the MEMS delay scans.

The P0 device has a static rocking curve width of about 3.7 mdeg. The 300-ps DTW can be generated only by an angular velocity of $1.2 \times 10^7$ degree $s^{-1}$. This value is achieved by a device associated with a maximum linear velocity of only 25 m $s^{-1}$ (less than one tenth the speed of sound in air) at the MEMS edges farthest from the flexure (125 μm), a unique advantage offered by the miniaturized and dynamic X-ray optics.

Discussion.

In some embodiments, the current 300-ps DTW is affected by the electronic noise in the driving circuits and the coarsely controlled environment where temperature and pressure around the devices can fluctuate. In some embodiments, the maximum amplitude of the device can be affected by several factors, such as the yield strength of silicon or any material used to fabricate the device, fluidic damping, and instability due to large forces vs. flexure strength. For the pulse pick theme (FIG. 1D), the physical limitation of the oscillation frequency of the microscopic (100 s μm) MEMS devices could be on the order of about 10 MHz. To achieve synchrotron pulse slicing (FIG. 1E) on a 3-ps time scale, a MEMS device would need to run at about a 50-MHz frequency and about a 15° amplitude. However, MEMS devices capable of dispersing/streaking should be attainable because future devices can run at a frequency of a few MHz while retaining ca. 5° oscillation amplitude, which is sufficient to improve the DTW to 100 ps and below. The resulting improvements will lead to full utilization of the advantages that come from ultra-bright X-ray sources for science in the time domain. These sources are often associated with very high bunch repetition rates (100-500 MHz)

and a stretched bunch width (approaching 200-ps FWHM) to avoid the space charging effect for improving emittance. Therefore, there is great potential for a higher-frequency MEMS, with time windows comparable to or narrower than the temporal width of the X-ray pulse itself, to be operated in an X-ray dispersion/streaking theme just in the X-ray optical domain, as illustrated in FIGS. 1F-1G. This will yield time-resolved information on sub-bunch time scales to facilitate time domain science without fundamentally altering the storage ring.

Thus far, there have been several electron deflecting methods utilized in the storage ring to generate deflected X-ray pulses that differ from unperturbed pulse trains for time-resolved experiments. The techniques employed kicker magnets or a quasi-resonant excitation of incoherent betatron oscillations. Both methods delivered selected X-ray pulses with similar spectral distributions as undeflected X-rays. The picked X-ray pulses propagate roughly along the unperturbed main beam, so that it only requires minimum modifications in the beamline instrument to use the picked pulses. Also, the picked pulses have similar photon wavelength spectral distribution (with a significant reduction in brilliance) so that the beamline can retain white- and pink-beam experiment capabilities. However, these electron-deflection schemes were only realized at low and medium-energy sources. With the MEMS scheme, pulse-picking works in monochromatic beam mode and the spectral brilliance is preserved. Since the storage-ring components are not involved, pulse picking using MEMS can be set up at any hard X-ray beamline in a similar fashion as conventional mechanical choppers, but orders of magnitude faster and miniaturized.

In some embodiments, using MEMS-device-based ultrafast X-ray optics operating at large oscillation amplitudes, X-ray pulses are able to be manipulated on time scales of about 300 ps. By utilizing the diffractive capability of a fast-oscillating MEMS device through Bragg angles for a monochromatic X-ray beam, a dynamic MEMS device can be an ultrafast X-ray pulse-picking instrument that maintains the spatiotemporal correlation of synchrotron X-rays with a 300-ps temporal resolution. This capability will be extremely useful at higher repetition rate, low-emittance X-ray sources worldwide. By developing ultrafast devices, the overwhelming synergy between the scalable MEMS-based dynamic optics and future X-ray sources is shown. The immediate application of the devices is to create new timing structures from high-repetition-rate storage-ring-based sources that are currently not suitable for time domain sciences. Further capability entails multiplexing X-ray pulses for time-domain experiments at a synchrotron radiation or high-repetition-rate XFEL source, so that multiple experiments can be accommodated simultaneously at a single-beam facility. This application requires higher f (for example, 100 kHz for a 1-MHz XFEL source) but a moderate DTW. The effects of radiation damage may need mitigation before the device can be used as a practical multiplexer at an XFEL source, but note that devices have run continuously when illuminated by an unfiltered synchrotron white beam with a power density of ca. 100 W/mm$^2$, modulated to a 1-Hz pulse train of 1.5% duty cycle (a macro-scale mechanical shutter opening 15 ms out of every 1 s). Looking beyond manipulating monochromatic X-rays, other applications include those that are currently accomplished by bulk X-ray optics such as a fast-scanning X-ray spectrometer or monochromator. Since the MEMS devices are almost 100% efficient, devices with such a narrow DTW can enable sub-nanosecond time-resolved research with lab-based X-ray sources.

Experimental Methods.

Design and Fabrication of MEMS.

Drastically improved from the asynchronous MEMS used in previous works, the MEMS device 200 such as the P0/2 and P0 devices, were designed as depicted in FIG. 2A. The MEMS device 200 include a (001)-oriented silicon single crystal suspended by a pair of comb-drive torsional actuators. The dimensions of the crystal are 25 µm in thickness and 250×250 µm$^2$ in the lateral directions. The comb-drive actuators are inter-digitated capacitors that provide electrostatic force to excite out-of-plane oscillation of the silicon crystal around the axis joining the torsional actuators. Beyond the region of oscillating diffractive element (e.g., a MEMS crystal, a silicon crystal, a single crystal micromirror etc.), electric wires were laid out connecting comb-drive actuators to electric inputs. Finite element analysis and CoventorWare simulation were utilized to aid the design with calculation of the modal response and resonant frequency of the MEMS devices. The fabrication was carried out at the commercial foundry MEMSCAP employing the SOIMUMPS process. The substrate (as depicted in FIG. 2A) may be a silicon-on-insulator wafer that provides the diffractive element necessary to diffract X-rays. Further, the SOIMUMPS fabrication process also includes steps of phosphorus doping and diffusion that introduce strains to the top silicon layer. The dopant is responsible for the shoulder peaks near and slightly above the Bragg reflection of silicon (slightly contracted lattice spacing).

Tuning the MEMS Resonant Frequency Using a Focused Ion Beam.

The tuning of the MEMS device resonant frequency was carried out using a focused ion beam (FEI Nova 600 NanoLab) housed inside a class-100 clean room at the Argonne Center for Nanoscale Materials. The device was grounded to the sample holder before loading into the sample chamber. The Ga ion source was tuned to 30 keV, 21 nA. In some embodiments the ion source is an ion beam mixing source, a local ion implantation source or any other ion source used for milling a MEMS device. A standard milling program for silicon was used to etch a set of rectangles away from the edges of the silicon crystal farthest from the oscillation axis of the torsional flexures, as shown in FIG. 2B. In some embodiments, standard milling programs are used when the diffractive element is silicon carbide, germanium, silicon-germanium or any other semiconductor material. In each tuning step, the removed pieces were symmetric to the axis of oscillation in order to avoid introducing an undesirable modal response in the device.

X-Ray Measurements.

X-ray measurements were carried out at experiment station 7ID-C at the APS. The static X-ray measurements of the rocking curves of the MEMS devices were identical to those described previously. For the time-resolved metrology of the MEMS devices, in some embodiments, two APS X-ray timing modes are used: standard 24-bunch mode with a pulse interval of 153 ns, and 324-bunch mode with a pulse interval of 11.37 ns. In both cases, the X-ray pulses are evenly distributed in time as the storage-ring is operated at 271.555 kHz for a period of 3.68 µs. Incident X-rays were monochromatized to an energy of 8 keV using a diamond (111) double-crystal monochromator. The X-ray beam was focused to ~10-µm horizontally by a rhodium-coated mirror, and confined by beam-defining slits to a 10-µm spot vertically. The MEMS device was mounted on a six-circle diffractometer for high-precision angular and lateral positioning. The X-ray beam was aligned to the center of the single-crystal silicon mirror at the (004) Bragg reflection in the vertical plane, thus taking advantage of the low emittance of the APS X-ray beam in the vertical direction. The diffracted X-rays passed through a flight path in vacuum and were then detected with customized avalanche photodiodes (APDs). The pulse signal of the APD could be sent either to a scaler (Joerger VSC16) to acquire the X-ray intensity (counting mode), or to a high-speed digitizing oscilloscope (Yokogawa DLM4058) to record the real-time X-ray response (integrating mode).

Measuring the X-Ray DTW of a MEMS Device Via Delay Scans.

To measure the sub-nanosecond DTW of the MEMS oscillators in real time, one would need a continuous X-ray source on the nanosecond time scale and an X-ray detector with 10-ps time resolution. The storage-ring frequency-matched MEMS devices allow for measuring the DTW using delay scans with synchrotron pulses of 100-ps FWHM and a detector with nanosecond time resolution. When the delay between the oscillatory motion of the MEMS device and an X-ray pulse from the APS is adjusted with a 20-ps step, the response from the slow detector generates the DTW profile with 20-ps time resolution. The measurement normally takes a few tens of seconds to complete, which is orders of magnitude more efficient than the coincidental scan with asynchronous devices.

Measuring MEMS Oscillation Amplitude with X-Ray Pulses.

The DTW of a MEMS device is inversely proportional to its oscillation amplitude, which is extremely sensitive to the environment's temperature and pressure. Therefore, evaluating the MEMS oscillation amplitude using X-ray pulses is critical before or after the DTW measurement. However, the temporal delay scan is not applicable for measuring the oscillation amplitude measurement. With the previous asynchronous device, the oscillation amplitude was measured precisely with coincidental scans by recording MEMS-diffracted X-ray pulses using a fast detector and a digitizing oscilloscope. The measurement of the frequency-matched device was similar to the coincidental mode, but it required high-frequency (or high-repetition-rate) X-ray pulses. When the MEMS resting angle ($\theta_0$) with respect to the X-ray beam is set to the Bragg angle ($\theta_B$), the diffracted pulse happens at time $\Delta\tau=0$ (zero phase difference). If this angle is set to be slightly different from $\theta_B$, the MEMS will diffract an X-ray pulse when the MEMS rotates to $\Delta\theta=\theta_0-\theta_B$ and the pulse coincidentally strikes the MEMS at the time instance ($\Delta\tau\neq0$, or a non-zero phase difference). A fit of $\Delta\theta$ vs ($\Delta\tau$) results in an accurate oscillation profile and amplitude even if only a small segment of data around $\Delta\tau=0$ is collected. Since the device is frequency-matched to the storage-ring or the incoming X-ray pulses, the coincidence-mode only works efficiently when the X-rays are densely populated in the time domain, so the 324-bunch mode of the APS was used. As the MEMS amplitude increases, its DTW width decreases and the probability of coincidence between the MEMS device's diffractive window and the incoming X-ray pulses decreases as well.

As used herein, the singular forms "a," "an," and "the" include plural referents unless the context clearly dictates otherwise. Thus, for example, the term "a member" is intended to mean a single member or a combination of members, "a material" is intended to mean one or more materials, or a combination thereof.

As used herein, the terms "about" and "approximately" generally mean plus or minus 10% of the stated value. For example, about 0.5 would include 0.45 and 0.55, about 10 would include 9 to 11, about 1000 would include 900 to 1100.

It should be noted that the term "exemplary" as used herein to describe various embodiments is intended to indicate that such embodiments are possible examples, representations, and/or illustrations of possible embodiments (and such term is not intended to connote that such embodiments are necessarily extraordinary or superlative examples).

As used herein, the terms "coupled," "connected," and the like mean the joining of two members directly or indirectly to one another. Such joining may be stationary (e.g., permanent) or moveable (e.g., removable or releasable). Such joining may be achieved with the two members or the two members and any additional intermediate members being integrally formed as a single unitary body with one another or with the two members or the two members and any additional intermediate members being attached to one another.

It is important to note that the construction and arrangement of the various exemplary embodiments are illustrative only. Although only a few embodiments have been described in detail in this disclosure, those skilled in the art who review this disclosure will readily appreciate that many modifications are possible (e.g., variations in sizes, dimensions, structures, shapes and proportions of the various elements, values of parameters, mounting arrangements, use of materials, colors, orientations, etc.) without materially departing from the novel teachings and advantages of the subject matter described herein. Other substitutions, modifications, changes and omissions may also be made in the design, operating conditions and arrangement of the various exemplary embodiments without departing from the scope of the present invention.

While this specification contains many specific implementation details, these should not be construed as limitations on the scope of any inventions or of what may be claimed, but rather as descriptions of features specific to particular implementations of particular inventions. Certain features described in this specification in the context of separate implementations can also be implemented in combination in a single implementation. Conversely, various features described in the context of a single implementation can also be implemented in multiple implementations separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

What is claimed is:

1. A microelectromechanical device for diffracting optical beams, the device comprising;
    a diffractive element suspended over a channel, the diffractive element configured to receive an optical beam and diffract the optical beam based on an orientation of the diffractive element, the diffractive element comprises at least one notch is formed at an edge of the diffractive element, which is parallel to an oscillation axis of the diffractive element; and at least one torsional actuator operatively connected to the diffractive element, the at least one torsional actuator configured to selectively adjust the orientation of the diffractive element, wherein the diffractive element having a diffractive element resonant frequency and the at least one notch causing the diffractive element resonant frequency to be the same as the resonant frequency of the optical beam.

2. The microelectromechanical device of claim 1, wherein the at least one notch comprises a first notch formed at each edge of the diffractive element that is parallel to the oscillation axis of the diffractive element, and a second notch formed within each of the first notch.

3. The microelectromechanical device of claim 2, further comprising:
a chamber defining an inner volume, the diffractive element and the at least one torsional actuator disposed within the internal volume, the internal volume being at a pressure lower than atmospheric pressure,
wherein the pressure causes the diffractive element resonant frequency to be nearly the same as the resonant frequency of the optical beam.

4. The microelectromechanical device of claim 1, wherein the at least one torsional actuator has a first end that is operatively connected to the diffractive element in a direction perpendicular to an oscillation axis of the diffractive element, a second end of the at least one torsional actuator electrically connected to a power source, the power source providing an electrostatic force such that the torsional actuators and the diffractive element are displaced at the diffractive element resonant frequency.

5. The microelectromechanical device of claim 4, wherein the at least one torsional actuator comprises a comb drive.

6. The microelectromechanical device of claim 4, wherein the at least one torsional actuator comprises at least one inter-digitated capacitor.

7. The microelectromechanical system of claim 6, further comprising:
a controller configured to relay a timing signal to the microelectromechanical device, wherein the controller comprises:
a delayer configured to delay the timing signal before the timing signal is received by the diffractive element; and
an amplifier configured to amplify the timing signal before transmitting the timing signal to the diffractive element.

8. A microelectromechanical system for diffracting optical beams, the system comprising:
a microelectromechanical device for diffracting optical beams comprising:
a diffractive element suspended over a channel, the diffractive element configured to receive an optical beam and diffract and/or transmit the optical beam based on orientation of the diffractive element;
at least one torsional actuator operatively connected to the diffractive element, the at least one torsional actuator configured to selectively adjust the orientation of the diffractive element, wherein the at least one torsional actuator has a first end that is operatively connected to the diffractive element in a direction perpendicular to an oscillation axis of the diffractive element, the at least one torsional actuator electrically connected to a power source, the power source providing an electrostatic force such that the torsional actuators and the diffractive element are displaced at the diffractive element resonant frequency;
a detector configured to receive the optical beam diffracted by the diffractive element and generate an output data; and
a display configured to receive the output data from the detector and display the output data.

9. The microelectromechanical system of claim 8, wherein the diffractive element comprises at least one notch, the at least one notch causing a diffractive element resonant frequency to be nearly the same as a resonant frequency of the optical beam.

10. The microelectromechanical system of claim 8, wherein the display is an oscilloscope configured to display a graphical image of the optical beam.

11. The micromechanical system of claim 8, wherein the diffractive element has a diffractive time window of 100 picoseconds to 2 nanoseconds.

12. A method, comprising: forming a diffractive element on a substrate, the diffractive element configured to receive an optical beam and diffract and/or transmit the optical beam based on an orientation of the diffractive element;
forming a channel in the substrate such that the diffractive element is suspended over the channel;
forming at least one torsional actuator on the substrate such that the torsional actuator is operatively coupled to the diffractive element; and
forming at least one notch in the diffractive element as to cause a diffractive element resonant frequency to be nearly the same as a resonant frequency of the optical beam.

13. The method of claim 12, the method further comprising:
placing the diffractive element and the at least one torsional actuator in a chamber defining an inner volume; and
reducing a pressure within the inner volume, the pressure being lower than atmospheric pressure as to cause the diffractive element resonant frequency to be nearly the same as a resonant frequency of the optical beam.

14. The method of claim 12, wherein the at least one notch is formed on an edge of the diffractive element that is parallel to an oscillation axis of the diffractive element.

15. The method of claim 12, wherein the at least one notch is formed using focused ion beam etching.

16. The method of claim 12, wherein the at least one notch comprises a first notch formed at each edge of the diffractive element that is parallel to an oscillation axis of the diffractive element, and a second notch formed within each of the first notch.

17. The method of claim 12, wherein the at least one torsional actuator and the diffractive element are operatively coupled to a torsional flexure arm.

18. The method of claim 12, wherein the torsional actuators formed are comb drive actuators.

* * * * *